(12) United States Patent
Gangopadhyay et al.

(10) Patent No.: US 9,011,710 B2
(45) Date of Patent: Apr. 21, 2015

(54) MAGNETIC-CORE POLYMER-SHELL NANOCOMPOSITES WITH TUNABLE MAGNETO-OPTICAL AND/OR OPTICAL PROPERTIES

(75) Inventors: Palash Gangopadhyay, Tucson, AZ (US); Alejandra Lopez-Santiago, Tucson, AZ (US); Robert A. Norwood, Tucson, AZ (US)

(73) Assignee: Arizona Board of Regents on behalf of the University of Arizona, Tucson, AZ (US)

( * ) Notice: Subject to any disclaimer, the term of this patent is extended or adjusted under 35 U.S.C. 154(b) by 329 days.

(21) Appl. No.: 13/262,035

(22) PCT Filed: Apr. 1, 2010

(86) PCT No.: PCT/US2010/029689
§ 371 (c)(1),
(2), (4) Date: Sep. 29, 2011

(87) PCT Pub. No.: WO2010/115043
PCT Pub. Date: Oct. 7, 2010

(65) Prior Publication Data
US 2012/0043495 A1 Feb. 23, 2012

Related U.S. Application Data

(60) Provisional application No. 61/211,645, filed on Apr. 1, 2009.

(51) Int. Cl.
*B32B 15/08* (2006.01)
*B32B 15/00* (2006.01)
(Continued)

(52) U.S. Cl.
CPC ........... *G01R 33/0322* (2013.01); *Y10S 977/84* (2013.01); *Y10S 977/896* (2013.01);
(Continued)

(58) Field of Classification Search
USPC .............. 522/81, 113, 114; 252/62.51, 62.54; 428/402, 403, 407, 457, 461; 977/840, 977/896, 897, 900, 901, 778, 779, 783, 773, 977/777; 524/430–439; 523/200, 202, 204, 523/205; 427/487, 508, 518, 532, 553, 212, 427/215, 220, 222, 214, 216, 217, 221
See application file for complete search history.

(56) References Cited

U.S. PATENT DOCUMENTS 4,157,323 A * 6/1979 Yen et al. ......................... 522/84
6,387,997 B1 5/2002 Grolemund et al.
(Continued)

FOREIGN PATENT DOCUMENTS

RO 122439 B1 4/2008
OTHER PUBLICATIONS

Rong et al. Structure-property relationships of irradiation grafted nano-inorganic particle filled polypropylene composites. Polymer 42 (2001) 167-183.*
(Continued)

*Primary Examiner* — Sanza McClendon
(74) *Attorney, Agent, or Firm* — Klarquist Sparkman, LLP

(57) ABSTRACT

Methods are disclosed for synthesizing nanocomposite materials including ferromagnetic nanoparticles with polymer shells formed by controlled surface polymerization. The polymer shells prevent the nanoparticles from forming agglomerates and preserve the size dispersion of the nanoparticles. The nanocomposite particles can be further networked in suitable polymer hosts to tune mechanical, optical, and thermal properties of the final composite polymer system. An exemplary method includes forming a polymer shell on a nanoparticle surface by adding molecules of at least one monomer and optionally of at least one tethering agent to the nanoparticles, and then exposing to electromagnetic radiation at a wavelength selected to induce bonding between the nanoparticle and the molecules, to form a polymer shell bonded to the particle and optionally to a polymer host matrix. The nanocomposite materials can be used in various magneto-optic applications.

36 Claims, 15 Drawing Sheets

(51) Int. Cl.
*C08J 3/28* (2006.01)
*G01R 33/032* (2006.01)

(52) U.S. Cl.
CPC ............ *Y10S 977/90* (2013.01); *Y10S 977/907* (2013.01); *Y10S 977/778* (2013.01); *Y10S 977/779* (2013.01); *Y10S 977/783* (2013.01); *Y10S 977/773* (2013.01); *Y10S 977/777* (2013.01)

(56) References Cited

U.S. PATENT DOCUMENTS

| | | | |
|---|---|---|---|
| 7,534,490 | B1 | 5/2009 | Goh et al. |
| 8,262,939 | B2 * | 9/2012 | Kim et al. ................. 252/500 |
| 2003/0180029 | A1 * | 9/2003 | Garito et al. ................ 385/142 |
| 2003/0223673 | A1 | 12/2003 | Garito et al. |
| 2003/0224214 | A1 | 12/2003 | Garito et al. |
| 2007/0172426 | A1 | 7/2007 | Lee et al. |
| 2008/0075667 | A1 | 3/2008 | Berkland et al. |
| 2009/0053512 | A1 | 2/2009 | Pyun et al. |
| 2009/0206040 | A1 | 8/2009 | Berg et al. |
| 2012/0052286 | A1 | 3/2012 | Norwood et al. |

OTHER PUBLICATIONS

Barnakov et al., "Spectral dependence of Faraday rotation in magnetite-polymer nanocomposites," *J. Phys. Chem. Solids.*, vol. 65, No. 5, pp. 1005-1010 (2004).
Choi et al., "Collective Behavior of Magnetic Nanoparticles in Polyelectrolyte Brushes," *Advanced Materials*, vol. 20, Issue 23, pp. 4504-4508 (2008).
Domínguez et al., "Magneto-optic Faraday effect in maghemite nanoparticles/silico matrix nanocomposites prepared by the Sol-Gel method," *Journal of Magnetism and Magnetic Materials*, vol. 320, Issue 20, pp. e725-e729 (2008).
Gangopadhyay et al., "Faraday Rotation Measurements on Thin Films of Regioregular Alkyl-Substituted Polythiophene Derivatives," *J. Phys. Chem. C*, vol. 112, pp. 8032-8037 (2008).
Ge et al., "Superparamagnetic Composite Colloids with Anisotropic Structures," *J. Am. Chem. Soc.*, vol. 129, pp. 8974-8975 (2007).
Gonsalves et al., "Magneto-optical properties of nanostructured iron," *Chemistry*, vol. 7, No. 5, pp. 703-704 (1997).
Guerrero et al., "Faraday rotation in magnetic $\gamma$-$Fe_2O_3$/$SiO_2$ nanocomposites," *Appl. Phys. Lett.*, vol. 71, Issue 18, pp. 2698-2700 (1997).
International Preliminary Report on Patentability, PCT/US2010/029689, Oct. 4, 2011, 8 pages.
International Search Report, PCT/US10/29689, May 24, 2010, 2 pages.
Jiang et al., "Magnetooptical Kerr effect in Fe—$SiO_2$ granular films," *J. Appl. Phys.*, vol. 78, No. 1, pp. 439-441 (1995).
Lopez-Santiago et al., "All-Optical Magnetometer based on Magnetite Core-Polymer Shell Nanocomposite Material," *Advances in Optical Materials*, 3 pages. (2009).
Lopez-Santiago et al., "Faraday rotation in magnetite-polymethylmethacrylate core-shell nanocomposites with high optical quality," *Applied Physics Letters*, vol. 95, Issue 14, p. 143302, 3 pages (2009).
Mahdavian et al., "Nanocomposite Particles with Core-Shell Morphology. I. Preparation and Characterization of $Fe_3O_4$-Poly(butyl acrylate-styrene) Particles via Miniemulsion Polymerization," *Journal of Applied Polymer Science*, vol. 110, Issue 2, pp. 1242-1249 (2008).
Novakova et al., "Magnetic properties of polymer nanocomposites containing iron oxide nanoparticles," *Journal of Magnetism and Magnetic Materials*, vol. 258-259, pp. 354-357 (2003).
Pan et al., "Wavelength dependence of the Faraday effect and magnetobirefringence in ferrofluid thin films," *J. Appl. Phys.*, vol. 73, No. 10, pp. 6139-6141 (1993).
Peyghambarian et al., "In-fiber Magneto-optic Devices Based on Ultrahigh Verdet Constant Organic Materials and Holey Fibers," Air Force Research Lab Report No. AFRL-SR-AT-TR-09-0071, 30 pages. (report dated Feb. 2, 2009).
Smith et al., "Magneto-optical spectra of closely spaced magnetite nanoparticles," *J. Appl. Phys.*, vol. 97, pp. 10M504-01-10M504-3 (2005).
Stichauer et al., "Optical and magneto-optical properties of nanocrystalline cobalt ferrite Films," *J. Appl. Phys.*, vol. 79, No. 7, pp. 3645-3650 (1996).
Strandwitz et al., "One- and Two-Photon Induced Polymerization of Methylmethacrylate Using Colloidal CdS Semiconductor Quantum Dots," *J. Am. Chem. Soc.*, vol. 130, pp. 8280-8288 (2008).
Written Opinion of the International Searching Authority, PCT/US10/29689, May 24, 2010, 7 pages.
Yusuf et al., "The wavelength dependence of Faraday rotation in magnetic fluids," *J. Appl. Phys.* vol. 64, No. 5, pp. 2781-2782 (1988).
Ziolo et al., "Matrix-Mediated Synthesis of Nanocrystalline $\gamma$-$Fe_2O_3$: A New Optically Transparent Magnetic Material," *Science*, vol. 257, No. 5067, pp. 219-223 (1992).

* cited by examiner

Monomers & tethering agents physisorbed on the surface

○ → *shell monomer*

Y → *tethering agent*

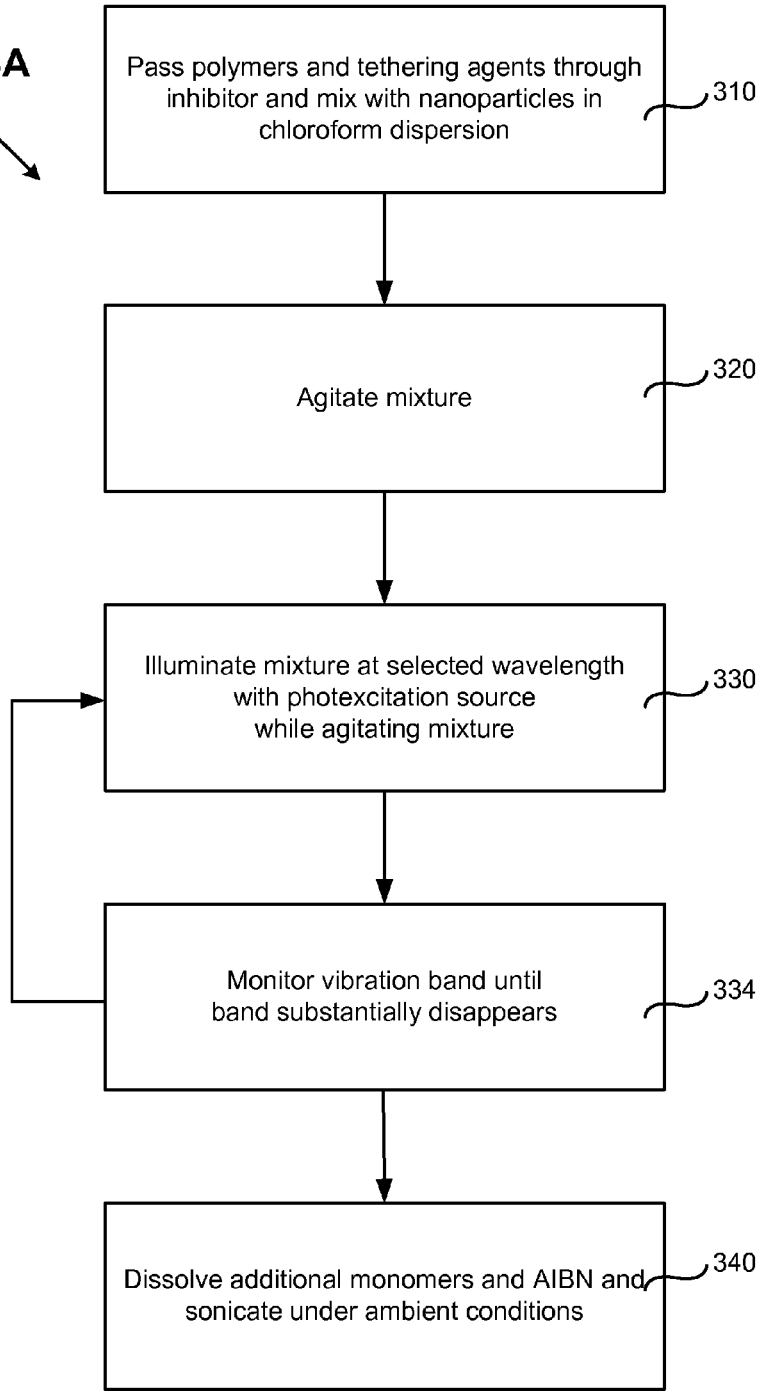

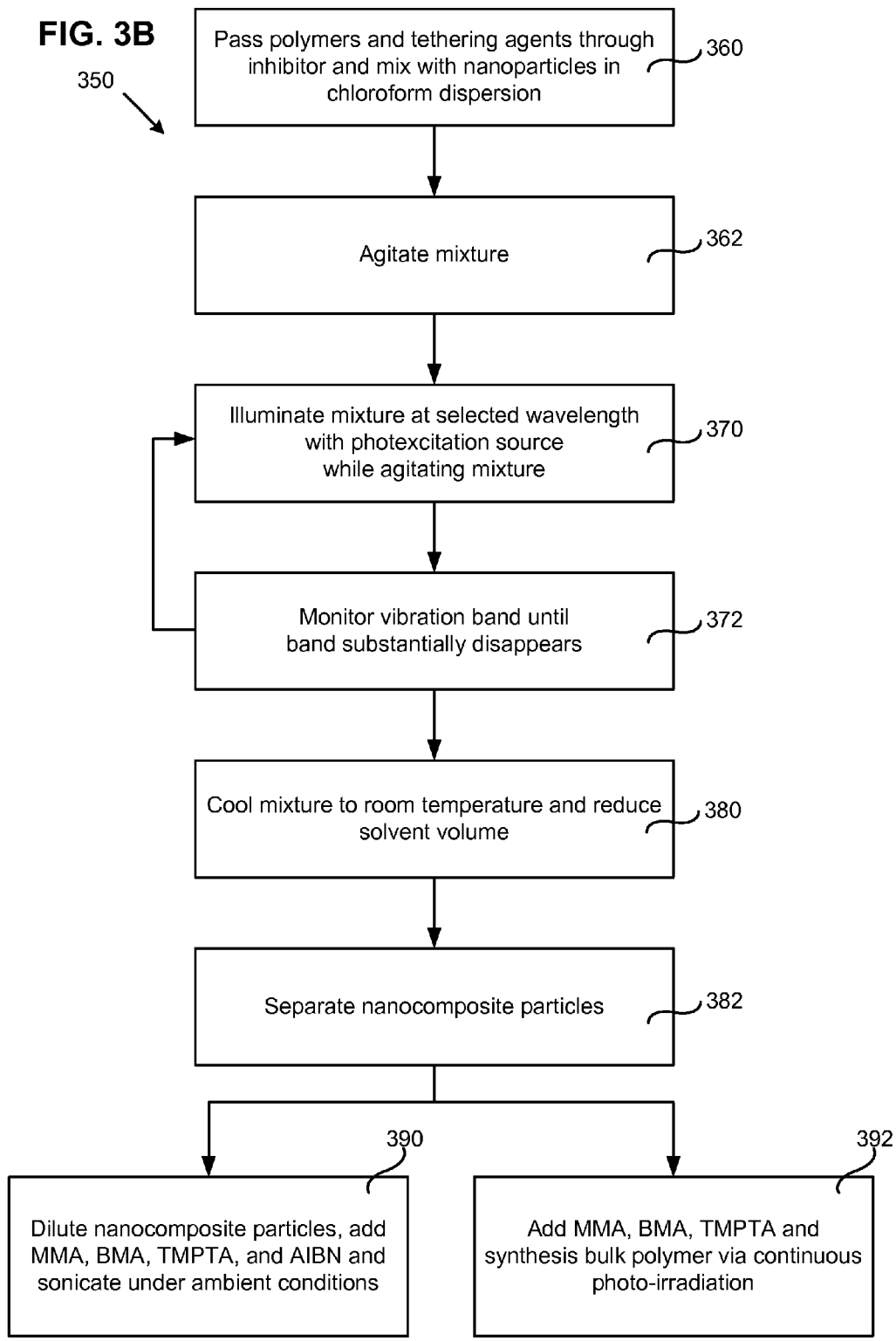

MAGNETIC-CORE POLYMER-SHELL NANOCOMPOSITES WITH TUNABLE MAGNETO-OPTICAL AND/OR OPTICAL PROPERTIES

CROSS-REFERENCE TO RELATED APPLICATION

This is the U.S. National Stage Application under 35 U.S.C. §371 of International Application No. PCT/US2010/029689, filed Apr. 1, 2010, which was published in English under PCT Article 21(2), which in turn claims priority to and the benefit of U.S. Provisional Application No. 61/211,645, filed Apr. 1, 2009. The provisional application is incorporated herein by reference in its entirety.

STATEMENT OF GOVERNMENT SUPPORT

This invention was made with Government support under grant number FA9550-06-1-0039 awarded by the U.S. Air Force Office of Scientific Research. The Government has certain rights in the invention.

FIELD

The present disclosure pertains to, inter alia, devices and methods for fabricating materials comprising ferromagnetic (metal or metal-oxide) nanoparticles coated with polymer shells and optionally embedded in a host matrix.

BACKGROUND

The design, synthesis and study of nanocomposite materials comprising magnetic nanoparticles embedded in a nonmagnetic "host matrix" have attracted significant interest over the last decade. Magnetic nanoparticles can include one or more of the following: para-, superpara-, and ferromagnetic particles. In this regard, a "nanocomposite" material is a material comprising nanoparticles embedded in, suspended in, or otherwise structurally associated with a different "host material," such as an organic polymer. An important group of these materials includes magneto-optic (MO) nanocomposites, which exhibit magneto-optical behavior under defined conditions. For example, MO properties of composites comprising Fe, Co, $\gamma$-$Fe_2O_3$, $Fe_3O_4$, or $CoFe_2O_4$ nanoparticles in various host materials such as any of various organic polymers, silica gels, colloidal silica particles, glass, or ion-exchange resins have been previously reported.

Examples of MO nanocomposites comprising Fe, Co, $\gamma$-$Fe_2O_3$, $Fe_3O_4$, or $CoFe_2O_4$ nanoparticles are discussed in these respective publications: Gonsalves et al., "Magneto-optical Properties of Nanostructured Iron," *J. Materials. Chem.*, Vol. 7, No. 5, pp. 703-704 (1997); Kalska et al., "Magneto-optics of Thin Magnetic Films Composed of Co Nanoparticles," *J. Appl. Phys.*, Vol. 92, page 7481 (2002); Guerrero et al., "Faraday Rotation in Magnetic $\gamma$-$Fe_2O_3$/SiO2 Nanocomposites," *Appl. Phys. Lett.*, Vol. 71, No. 18, pp. 2698-2700 (1997); Barnakov et al., "Spectral Dependence of Faraday Rotation in Magnetite-Polymer Nanocomposites," *J. Phys. Chem. Solids.*, Vol. 65, No. 5, pp. 1005-1010 (2004); and Stichauer et al., "Optical and Magneto-optical Properties of Nanocrystalline Cobalt Ferrite Films," *J. Appl. Phys.*, Vol. 79, No. 7, pp. 3645-3650 (1996). Examples of MO nanocomposites in which the host material is an organic polymer and an ion-exchange resin may be found in these respective publications: Smith et al., "Magneto-optical Spectra of Closely Spaced Magnetite Nanoparticles," *J. Appl. Phys.*, Vol. 97, pp. 10M504-01-10M504-3 (2005) and Ziolo et al. "Matrix-Mediated Synthesis of Nanocrystalline $\gamma$-$Fe_2O_3$: A New Optically Transparent Magnetic Material," Science, Vol. 257, No. 5067, pp. 219-223 (1992).

MO nanocomposites offer possibilities of exploiting the magnetic and/or optical properties of the nanoparticles and the processability of the host material. MO-active nanocomposites offer tantalizing prospects for use in magnetic field sensors, integrable optical isolators, polarizers, and rotators, high-speed MO modulators, and information storage (e.g., as used in data-storage devices comprising MO-active nanocomposite media).

For example, a composite of $\gamma$-$Fe_2O_3$ nanoparticles in an organic resin absorbs less incident electromagnetic radiation than bulk $\gamma$-$Fe_2O_3$ particles. Ziolo et al., "Matrix-Mediated Synthesis of Nanocrystalline $\gamma$-$Fe_2O_3$: A New Optically Transparent Magnetic Material," *Science*, Vol. 257, No. 5067, pp. 219-223 (1992). Also, Fe nanoparticles suspended in a matrix material produce a larger MO effect than the bulk Fe particles, and the magnitude of the MO effect appears to be dependent both on particle density and the characteristics of particle/host material interface. Sepulveda et al., "Linear and Quadratic Magneto-optical Kerr Effects in Continuous and Granular Ultrathin Monocrystalline Fe Films," *Phys. Rev. B*, Vol. 68, page 064401 (2003), and Jiang et al., "Magnetooptical Kerr Effect in Fe—SiO Granular Films," J. Appl. Phys., Vol. 78, No. 1, pp. 439-441 (1995).

Although the properties of isolated single-domain magnetic nanoparticles are relatively well understood, the competition between single-particle responses and correlation effects produced by nanocomposites of such particles continues to be an area of intense research. One challenge in assembling a magnetic nanocomposite material is achieving a uniform dispersion of the nanoparticles in the host material with minimal clustering of the magnetic nanoparticles. Even ambient magnetic fields, such as that of the Earth, encourage formation of aggregates of magnetic nanoparticles whenever they are free to move about. Rigidification of the host material inhibits migration and aggregation of the nanoparticles. But, many problems remain with conventional methods for producing nanocomposite materials, especially such materials having particular functional properties. In view of the foregoing, there is a need for improved methods for producing nanocomposites, including MO nanocomposites, without producing unwanted aggregations and/or clusters of the nanoparticles, and that allow reliable production of nanocomposites having one or more target properties.

SUMMARY

The nanocomposite materials disclosed herein have applications in various magnetic and magneto-optic (MO) high-speed sensors and devices, such as, but not limited to, magnetic field sensors, optical isolators, optical reflectors, optical rotators, and data-storage devices.

The present disclosure provides, inter alia, methods for producing nanocomposite materials, including MO nanocomposites. Representative methods include a step in which polymer shells are formed by controlled surface polymerization around individual nanoparticles while maintaining the nanoparticles in, for example, a suspended condition. The product of this step comprises "nanoparticle core-polymer shell" (abbreviated NC-PS) nanocomposite particles. The polymer shells on such particles prevent the nanoparticles from forming agglomerates and can be used to obtain and/or preserve a particular size dispersion of the nanoparticles.

The shells can be formulated to achieve a desired functional property of the nanoparticles. The NC-PS nanocomposite particles can be further introduced into a suitable host material (or "host matrix material" or "matrix material," such as an organic or other type of polymer) to form a nanocomposite material having mechanical, optical, MO, and/or thermal properties that have been "tuned" for a particular use, application, or product. Example embodiments include: (1) forming a suspension of NC-PS nanocomposite particles; and (2) chemically linking the polymer shells "to" (i.e., on or in) the host material. In this way, for example, NC-PS nanocomposite particles comprising $Fe_3O_4$ nanoparticles are prepared and dispersed in a matrix material (e.g., PMMA) with little or no aggregation of the nanoparticles. These particular composites exhibited an appreciable degree of optical transparency in the visible and near-infrared (NIR) region. Also, as measured by Faraday rotation, these NC-PS nanocomposite particles exhibit magneto-optical properties that appear to be synergistically related to the constituent magnetic nanoparticles. As will be discussed further below, these composites can be used in various MO applications.

Various embodiments of the disclosed technology exhibit several advantages. First, the polymerization reaction(s), especially for forming the shells, desirably are cationically mediated, which allows exercising control over several variables of the process and of the products formed thereby, including but not limited to: Faraday rotation (FR), shell thickness of the NC-PS nanocomposite particles, refractive index (RI) of the resulting nanocomposite structure, as well as certain mechanical advantages. Exemplary mechanical advantages include little to no agglomeration of nanoparticles in the final composite, which results in formation of a nanocomposite material having a desired distribution (including but not limited to uniform distribution) of nanoparticles and/or exhibiting high optical transmission (transparency) and material toughness such as crack-resistance. Other mechanical advantages are realized by manipulating the structural and compositional uniformity of the material.

An exemplary embodiment of the subject method comprises preparing a mixture comprising nanoparticles and molecules of at least one monomer dispersed in a solvent, wherein each nanoparticle has a surface and is insoluble in the solvent. The molecules of the at least one monomer are allowed to associate with the surfaces of the nanoparticles. The mixture is exposed to electromagnetic radiation having at least one wavelength selected to photoactivate the surfaces of the nanoparticles and the molecules of the at least one monomer so as to form electron holes on the surfaces of the nanoparticles and on the associated molecules. Thus, covalent bonding of the molecules of the at least one monomer is preferentially induced to the surfaces of the nanoparticles and to each other on the surfaces, thereby forming a polymer shell on the surfaces of the nanoparticles and forming a suspension of nanoparticle-core polymer-shell nanocomposite particles.

The nanocomposite particles have stability for storage. They can be used as-is or incorporated into any of various host materials such as polymers and the like. The host material can have significant dimensions in all three axes, as in blocks or cylinders, or can be planar, such as a film. The host material can be a network polymer.

The foregoing and other objects, features, and advantages of the invention will become more apparent from the following detailed description, which proceeds with reference to the accompanying figures.

BRIEF DESCRIPTION OF THE DRAWINGS

FIG. 3A is a flow chart that outlines another exemplary implementation of the method shown in FIGS. 1A-1E and FIG. 2.

FIG. 3B is a flow chart that outlines another exemplary implementation of the method shown in FIG. 2.

DETAILED DESCRIPTION

I. General Considerations

Figure 1A:
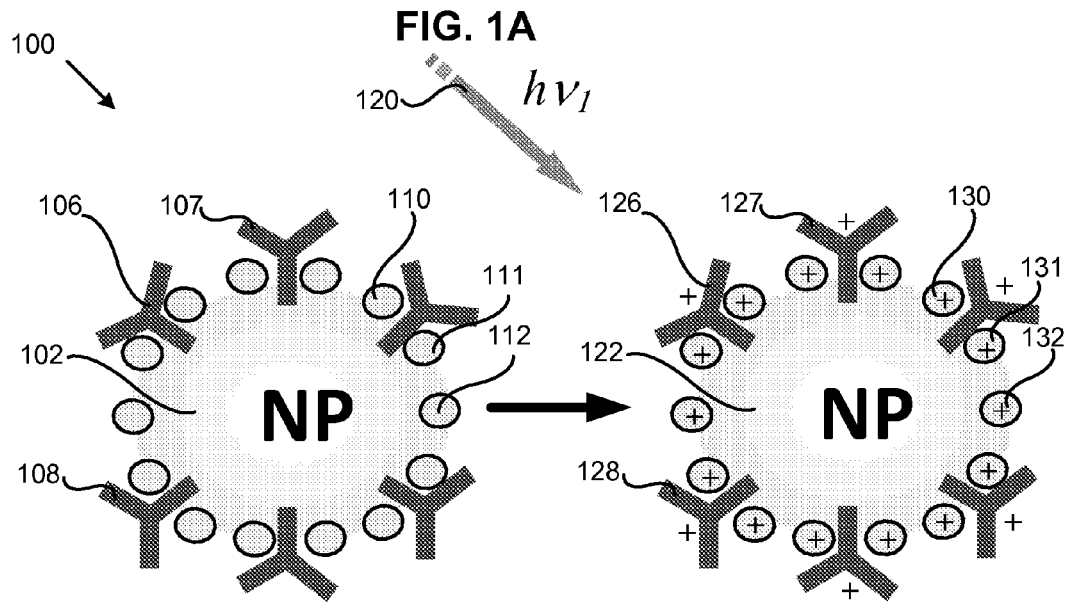
FIGS. 1A-1E are schematic diagrams of respective steps of an exemplary process for synthesizing nanoparticle core—polymer shell (NC-PS) nanocomposite particles suspended in a cross-linked polymer matrix.

Disclosed below are representative embodiments of methods, apparatus, and systems for the design, synthesis, and study of magneto-optic (MO) nanocomposite materials comprising nanocomposite core-polymer shell (NC-MS) nanocomposite particles (e.g., nanoparticles of a ferromagnetic material) embedded in a non-magnetic host material ("host matrix"). The disclosed methods, apparatus, and systems should not be construed as being limiting in any way. Instead, the present disclosure is directed toward all novel and non-obvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other things and methods. Additionally, the description sometimes uses terms like "produce," "generate," "select," "receive," "exhibit," and "provide" to describe the disclosed methods. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Moreover, unless the context dictates otherwise, the term "coupled" means mechanically, electrically, or electromagnetically connected or linked and includes both direct connections or direct links and indirect connections or indirect links through one or more intermediate elements not affecting the intended operation of the described system.

Additionally, certain terms may be used such as "up," "down," "upper," "lower," and the like. These terms are used, where applicable, to provide some clarity of description when dealing with relative relationships. But, these terms are not intended to imply absolute relationships, positions, and/or orientations.

Many metal, metal oxide, and semi-metallic oxide nanoparticles have large optical band gaps. For example, stoichiometric magnetite (as an exemplary ferromagnetic material) has a highest occupied molecular orbital (HOMO) at 5.5-6.0 eV, with a band gap of 6 eV to the lowest unoccupied molecular orbital (LUMO). The absorption edge in pure bulk $Fe_3O_4$ originates from the transition from the 2p orbital of oxygen to the 3d orbital of iron. However, in nano-sized particles of this material, the increased surface area generates a larger number of surface states within the band gap, effectively reducing the band gap and thereby pushing the absorption edge toward the visible wavelength regime. Furthermore, decreasing the total volume of particles in a suspension thereof decreases the probability of their recombining with one another, making more carriers available for achieving oxidation or reduction of surface-adsorbed molecules. This oxidation property is used in various embodiments described below to form individual polymer shells around the nanoparticles that are directly and firmly attached to the surfaces of the nanoparticles. For example, in the case of $Fe_3O_4$, a polymer shell is bonded to the surface of each nanoparticle by an O—C bond, wherein the oxygen is from $Fe_3O_4$, and the carbon is from the shell polymer. Shell formation desirably occurs by cationically mediated polymerization of monomers that have been adsorbed on the nanoparticle surfaces. Cationic polymerization is desirably facilitated by photo-excitation, which is easily performed and controlled.

FIGS. 1A-1E are schematic representations of steps in a representative method. FIG. 1A is a schematic 100 illustrating photoexcitation of a metal-oxide nanoparticle in the presence of monomers. "Monomers" are relatively simple and low-molecular-weight chemical compounds that can be covalently linked together (e.g., in the manner of beads on a string) under particular conditions to form chains and similar high-molecular-weight compounds or structures, termed "polymers." The monomers can be a single compound or multiple compounds capable of polymerizing with each other. In general, a molecule of a "monomer" has two or more "active groups" that are capable of participating in covalent bonding to become attached to nanoparticle surfaces and covalent bonding with each other to become linked together to form the polymer shells on the surfaces of the nanoparticles. The monomers desirably also include molecules of at least one "tethering agent." A tethering agent molecule can be an oligomer of two or more molecules of the monomer providing at least three active groups. Alternatively, the tethering agent molecule is a molecule of a different polymerizable compound providing at least three active groups. As they become incorporated into a polymer, the tethering agent molecules produce branching of the polymer, which can produce more satisfactory polymer shells. In any event, the monomer molecules (which may or may not include molecules of tethering agent) are destined to polymerize on the surfaces of the nanoparticles to form a polymer shell around each nanoparticle.

As shown, before photoexcitation, the nanoparticle 102 has physisorbed (physically adsorbed) several molecules, 106, 107, 108, etc., of a tethering agent and several molecules 110, 111, 112, etc., of another monomer on the surface of the nanoparticle. In certain embodiments more than one type of monomer can be used and/or more than one type of tethering agent can be used. Light 120 having a preselected first excitation energy $hv_1$ is irradiated on the mixture. The first excitation energy $hv_1$ is selected to excite generation of electron and holes on the surface of the nanoparticle without initiating a polymerization reaction of the surrounding monomer molecules. This photoexcitation generates a large concentration of charge carriers on the particle surface. As the tethering agents 126-128 and monomers 130-132 become physisorbed on the nanoparticle 122 surface, they exhibit a positive charge due to transfer of the holes from the nanoparticle surface to the molecules of the tethering agent and monomer.

Another advantage of including molecules of a tethering agent(s) with the molecules of monomer is that the molecules of tethering agent facilitate cross-linking between adjacent linear polymer strings of monomer molecules. Good polymer shells can be produced from polymerization of molecules of tethering agent alone. It is difficult to produce good polymer shells from polymerization of only molecules of monomer. This is because most monomers tend to form hair-like chains without branching, which tends to form a poor shell. Hence, in most embodiments, it is desirable to use at least one monomer and at least one tethering agent to form the polymer shells.

Figure 1B:
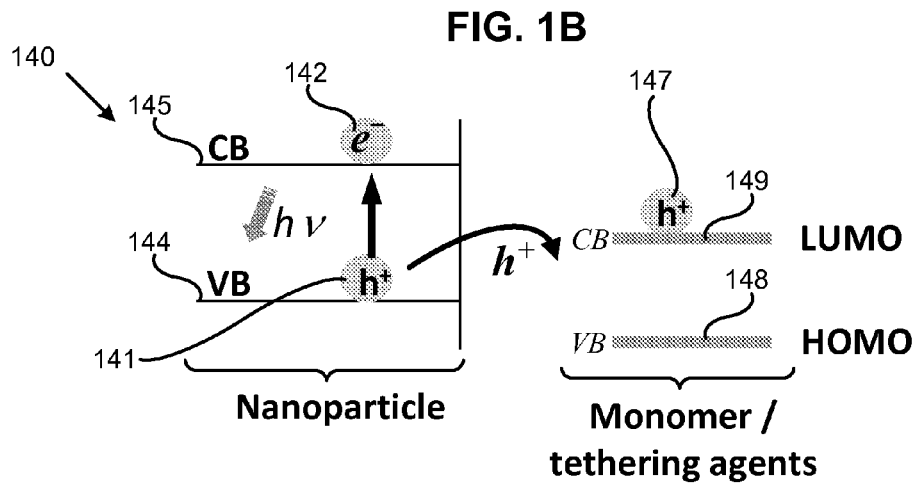

FIG. 1B is a schematic 140 illustrating the conduction bands 145, 149 and the valence bands 144, 148 for the nanoparticles and for a solution of monomer/tethering agent, respectively. By selecting monomer(s) and tethering agent(s) having respective magnitudes of the energy band gap similar to the energy-based gap of the nanoparticles, holes generated within the nanoparticle valence band (VB) 144 can be easily trapped or transferred as respective holes 147 occupying the lowest unoccupied molecular orbital (LUMO) 149 of the molecules of monomer and tethering agent adsorbed on the nanoparticle surface. For example, a hole 141 is created when a photon is absorbed, thereby generating an electron 142 in the conduction band 145 of the nanoparticle. The holes thus formed on the nanoparticle surface and on molecules of monomer and tethering agent are particularly useful for covalently bonding the molecules to the nanoparticle surface. For example, some embodiments of the disclosed technology involve formation of O—C linkages of oxide nanoparticles with adsorbed molecules of an acrylate-type monomer. In other embodiments, e.g., involving metallic or semi-metallic nanoparticles, M—C or M—O—C linkages are formed. These linkages all involve strong covalent bonding of the molecules of monomer(s) and tethering agent(s) to the nanoparticle surface.

Figure 1C:
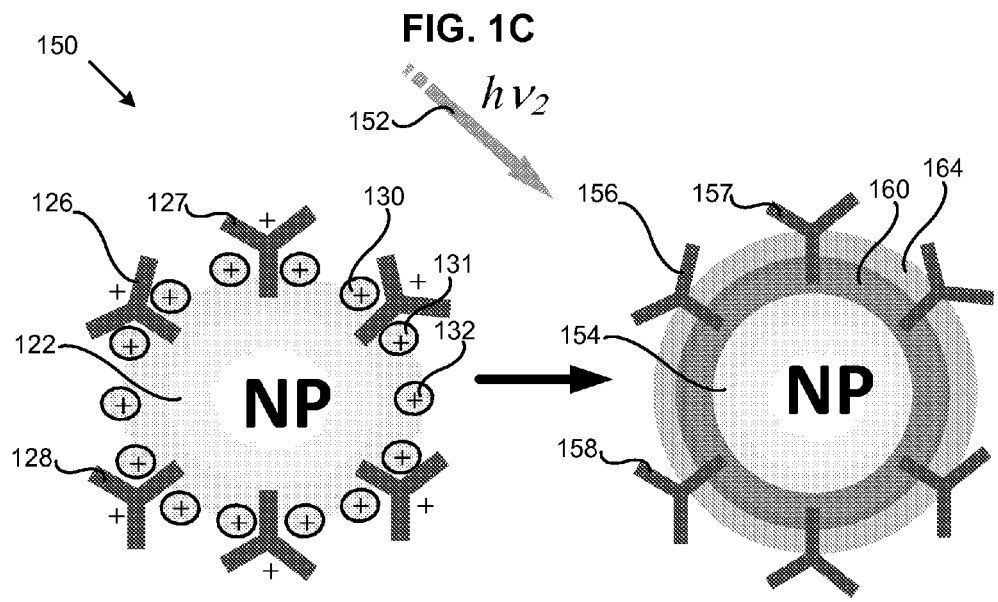

FIG. 1C is a schematic 150 illustrating formation of a polymer shell on the surface of the nanoparticle 122. Shell formation is initiated by exposure to light 152 having a second excitation energy $hv_2$. In some embodiments the excitation energy $hv_1$ of the light 120 used during the first photoexcitation is the same as the excitation energy $hv_2$ of the light 150 used during the second photoexcitation (but is simply directed at the suspension for a longer time). In other examples, the excitation energies $hv_1$ and $hv_2$ are different. In either case, the excitation energies $hv_1$ and $hv_2$ are selected based on the materials selected for the nanoparticles, monomer(s), and tethering agent(s), and to favor polymerization reactions on the nanoparticle surface compared to elsewhere. Due to the earlier generation of a large concentration of holes, the particle surface now acts as an initiation center for the polymerization reactions. As the nanoparticle 122 is illuminated, the molecules of tethering agent 156, 157, 158, etc., covalently bond with each other and thus polymerize on the surface of the nanoparticle 154, forming a first shell portion 160. Also, photoactivated molecules of the monomer 130, 131, 132, etc., also covalently bond with each other on the surface, forming a second shell portion 164. In addition, molecules of the monomer also bond to molecules of the tethering agent on the surface. All these polymerization reactions result in formation of a polymer shell around each nanoparticle, wherein the shells are firmly bonded to the particle surfaces. Based on the selection of $hv_1$ and $hv_2$, the selection of monomer(s) and tethering agent(s) (or of the tethering agent(s) if used alone), and optionally on the selection of cross-linking agents (other than tethering agents), the desired shells are formed on the particle surfaces. The photoexcitation wavelength $hv_2$ is selected so that the light promotes polymer-shell formation. Also, the time duration of at least the second photoexcitation can be selected in order to produce an outer shell 164 having a desired thickness. The product of this reaction is a suspension of nanocomposite particles each having a nanoparticle core and at least one polymer shell. These particles are termed "nanoparticle core-polymer shell (NC-PS) nanocomposite particles.

In a subsequent step, performed if desired, the NC-PS nanocomposite particles are incorporated into a bulk polymer "matrix material." In some embodiments the same monomer(s) and tethering agent(s) as used to form the NC-PS nanocomposite particles are used to form the bulk polymer, wherein the polymer shells are crosslinked to the material of the bulk polymer. For example, see FIG. 6C and associated text below.

Figure 1D:
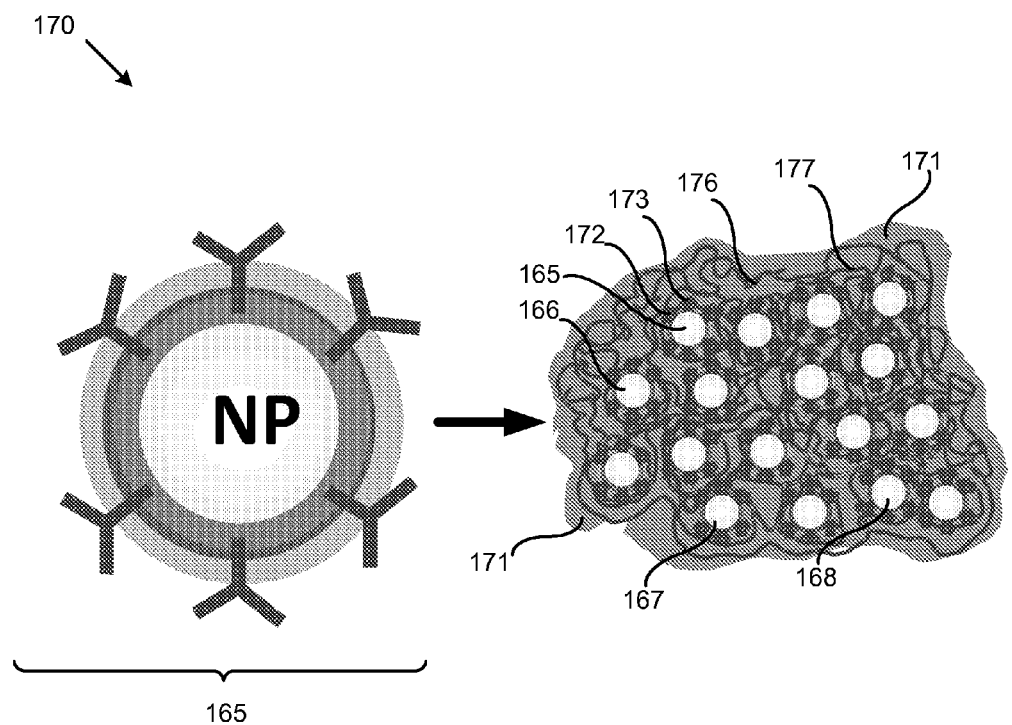

FIG. 1D is a schematic 170 illustrating cross-linking of the completed NC-PS nanocomposite particles 165, 166, 167, 168, etc., into a bulk-polymer matrix 171. As shown, the shells of the nanocomposites are cross-linked into the polymer matrix by forming covalent bonds between active groups on molecules of the tethering agent(s) and active groups on molecules of the polymer matrix 176, 177, etc., at the sites 172, 173, etc.

In some embodiments the monomer(s) and tethering agent(s) used for forming the polymer matrix can be the same as used for forming the shells on the nanoparticles. In other embodiments, the monomer(s) and/or tethering agent can be different from those used to form the shells. Strategic selection and manipulation of the types and concentrations of particles, monomer(s), tethering agent(s), cross-linking agent(s), cross-linking inhibitor(s), solvent, thermal conditions, activation energies, and agitation conditions are important factors in controlling shell thickness and in the incidence or prevention of aggregation that can be used to achieve optimal conditions for each stage of the process.

Figure 1E:
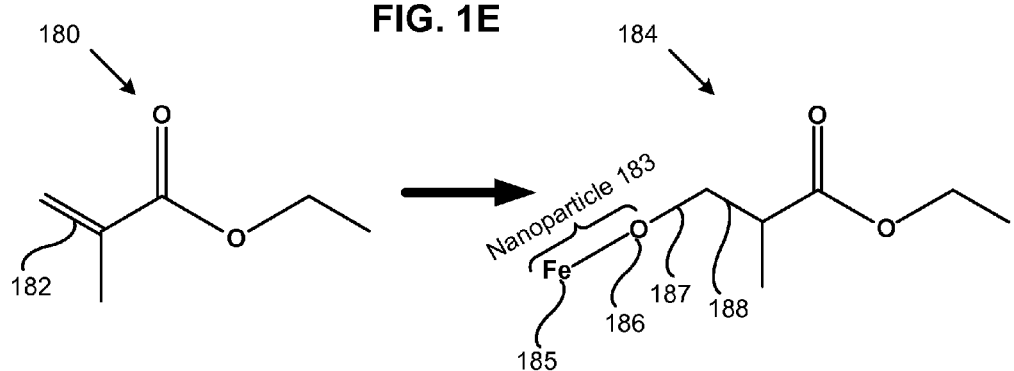

FIG. 1E is a diagram showing cationically mediated bonding that an ethyl acrylate monomer 180 undergoes in a photoexcitation reaction with the surface of a $Fe_3O_4$ nanoparticle 183. As shown, the un-bonded monomer molecule 180 has a terminal ethylene group (C=C) 182. During bonding of the monomer 184 to an activated Fe—O on the nanoparticle 183, the double bond 182 becomes a C—C single bond 188 as the terminal carbon becomes bonded 187 to the Fe—O oxygen 186. The iron atom 185 is attached to the $Fe_3O_4$ nanoparticle 183.

Figure 1F:
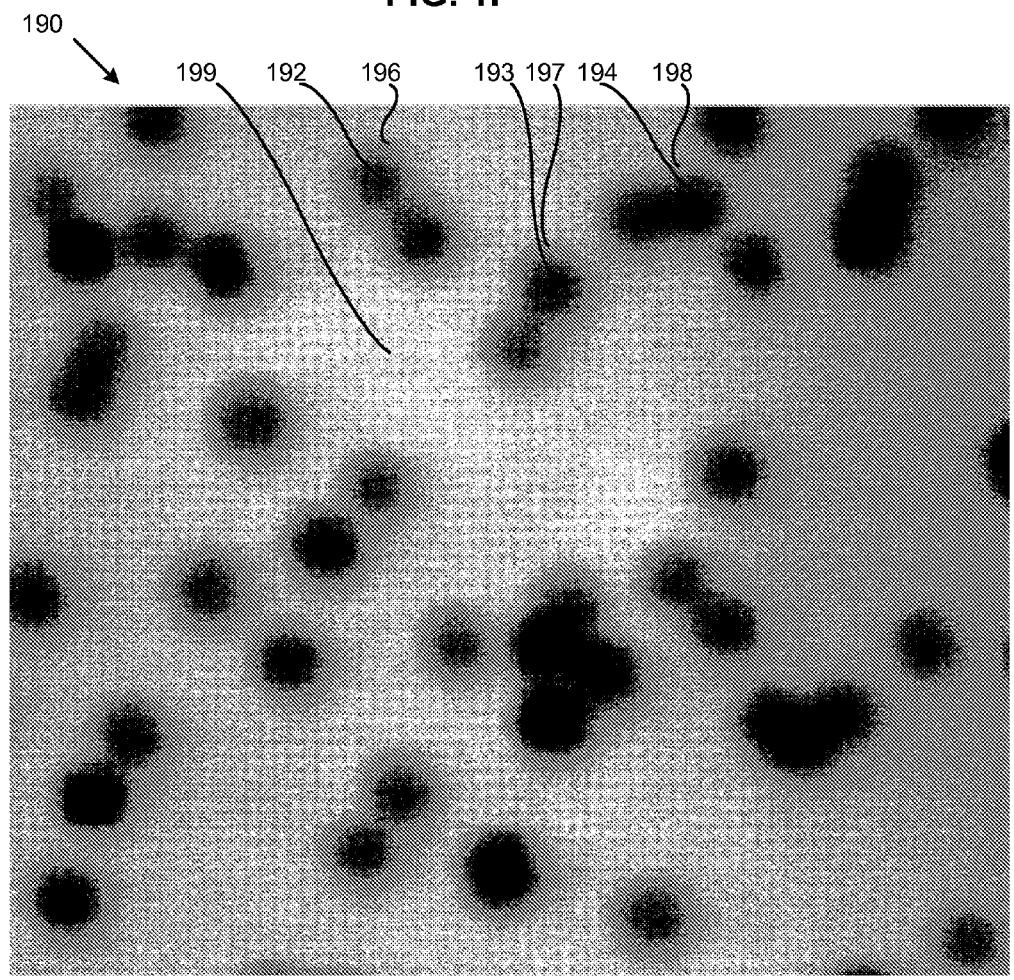
FIG. 1F is a scanning transmission electron micrograph (STEM) of a cross-linked polymer matrix comprising dispersed NC-PS nanocomposite particles, formed according to the exemplary process depicted in FIG. 1A.

By way of example, FIG. 1F is a scanning transmission electron micrograph (STEM) 190 of a nanocomposite comprising several nanoparticles 192-194 with polymer shells 196-198 cross-linked in a bulk polymer matrix 199 formed according to the method depicted in FIGS. 1A-1E.

II. Example Nanoparticle Synthesis

Figure 2:
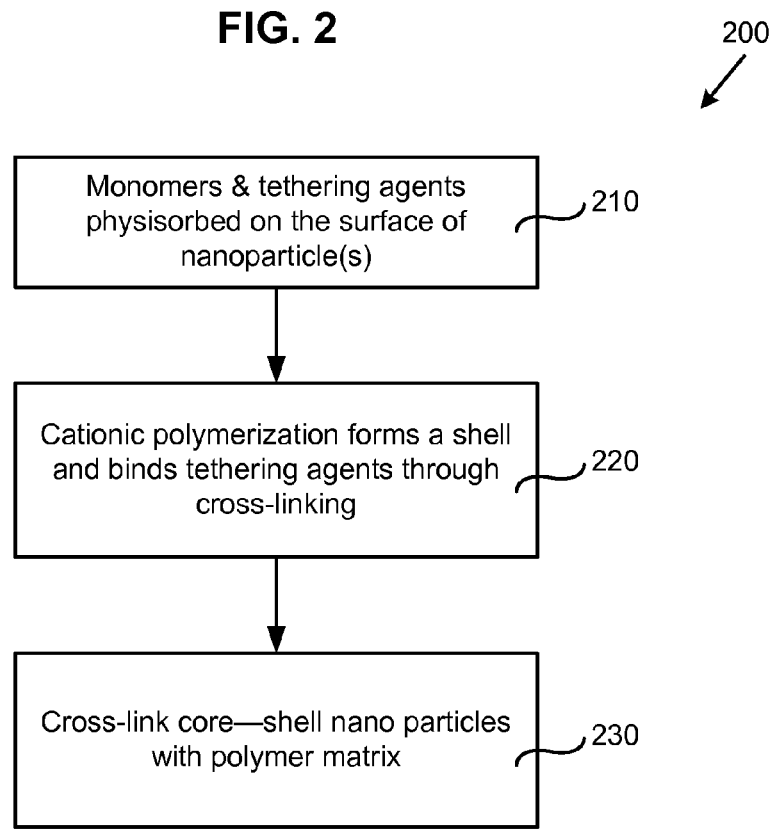
FIG. 2 is a flow chart that outlines an exemplary implementation of the method shown in FIG. 1A.

FIG. 2 is a flow chart 200 of an embodiment of a method for preparing NC-PS nanocomposite particles and for incorporating the particles in a cross-linked polymer matrix. The types and concentrations of particles, monomer(s), tethering agent(s), cross-linking agent(s), cross-linking inhibitor(s), choice of solvent, thermal conditions, activation energies, and agitation conditions are important factors in controlling shell thickness and incidence or prevention of aggregation. Once the initial NC-PS nanocomposite particles are formed, they can be further dispersed or incorporated in a bulk polymer (or other host material) of choice in order to exploit the electronic and optical properties of the nanoparticles while also taking advantage of the ease of formation and/or processability of the host material. As shown in FIG. 2, an embodiment of the process for preparing the composite material proceeds as follows.

At process block 210, molecules of one or more monomers and molecules of one or more tethering agents are physisorbed (physically adsorbed) on the surface of nanoparticles suspended in a suitable solvent such as chloroform. In some examples, the monomers and tethering agents are the same compound, while in other examples, the monomers and tethering agents are of different compounds. In some examples, the molecules of monomers and/or tethering agents are intercalated with each other on the surface of the nanoparticle. These molecules also or alternatively may be intercalated in interstices on the nanoparticle surface.

At process block 220, a respective polymer shell is formed on the surface of each of the nanoparticles using photo-activated cationically mediated polymerization. The suspension of nanoparticles, monomer(s), and tethering agent(s) is exposed to light (e.g., laser light) produced by a photoexcitation source. The light has a first spectral density $hv_1$ selected to according to a predetermined matching of the energy band gap of the particles with band gap(s) of the monomer(s) and tethering agent(s) used. The resulting excitation causes molecules of the monomer(s) and tethering agent(s) to become cationic via charge (hole) transfer from the nanoparticle surface to the molecules of the monomer(s) and tethering agent(s), thereby facilitating covalent bonding of the molecules to the nanoparticle surface and to each other. In some examples, the molecules of tethering agent(s) form a monomolecular layer shell on the surface of the nanoparticle, while in other examples the molecules of tethering agent(s) form a thicker shell. In yet other examples, the monomer(s) are selected to form a thicker polymer shell than otherwise would be formed by tethering agent(s) alone, for example, 1-20 nm thick. Reasons for forming the polymer shells around the nanoparticles include: isolating the nanoparticles from each other and from the rest of the composite as subsequent processing steps are carried out, and allowing adjustment of the magnetic and/or optical properties of the final composite to achieve a desired performance.

At process block 230, after forming the initial NC-PS nanocomposite particles, the particles are incorporated ("networked") into a cross-linked polymer matrix using appropriate proportions of different monomer(s) and by using a thermal polymerization technique. If desired or necessary, one or more crosslinking agents can be included. This step is called "networking" the NC-PS nanocomposite particles because the cross-linked polymer matrix is termed a "network" material as a result of the cross-linking reaction by which the material is formed. In the network, the NC-PS nanocomposite particles are held in place by covalent bonds between the matrix material and the shells on the nanoparticles. The techniques that can be used for networking the core-shell nanoparticles include: one-step thermal polymerization, two-step thermal polymerization, and continuous photo-irradiative polymerization. More details regarding these techniques are discussed further below.

III. Exemplary Synthesis of $Fe_3O_4$ CORE—PMMA—PBMA—TMPTA Shell Nanocomposites: One-Step Method FIG. 3A is a flow chart 300 showing an embodiment of a method for preparing NC-PS nanocomposite particles, and for networking the particles into a cross-linked polymer matrix. The method shown in the flow chart 300 can be called a "one-step" method because the final polymerization of the mixture occurs immediately after the polymer shells have been formed, simply by extending the shell-formation reaction conditions in the presence of additional monomer(s) and tethering agent(s). This is in comparison to a so-called "two-step" method, discussed in FIG. 3B and accompanying text, in which the NC-PS nanocomposite particles are first separated from the suspension in which they are formed and then polymerized into a matrix material in a subsequent (and separate) polymerization step.

At process block 310, $Fe_3O_4$ particles with desired diameters (e.g., 5, 10, 15, 20, 25 and/or 40 nm) are dispersed in a chloroform solvent. For example, $Fe_3O_4$ particles purchased from Ocean Nanotech, LLC, can be used as received from the manufacturer. One or monomers are then added to the particle/solvent suspension. Desirably, the monomers are highly soluble in the solvent. Example monomers are methylmethacrylate (MMA), benzylmethacrylate (BMA), and trimethylolpropanetriacrylate (TMPTA), which can be used separately in respective methods or used as a mixture of one or more. In one example, 10 mg of nanoparticles dispersed in 100 mL of chloroform were mixed with 0.25 mL of MMA, 0.2 mL of BMA, and 50 μL of TMPTA. The TMPTA was used principally as a tethering agent.

At process block 320, the mixture is agitated (e.g., by sonication) before being illuminated. Sonication disperses the particles and other ingredients thoroughly. For example, the mixture was sonicated for 2 hrs at 65° C. using a bath-type or probe-type sonicator. At process block 330, the mixture is illuminated using a photoexcitation source (e.g., a source of light having a wavelength of 360-400 nm and a nominal power of 10 mW/cm$^2$). The wavelength of the photoexcitation source is selected according to predetermined criteria to correspond closely with the energy band gap of the particles versus of the monomer(s) and tethering agent(s) in the suspension. Photoexcitation is continued for a length of time (e.g., 2.5 hours), based on reaction monitoring at process block 334, during which the reaction mixture is refluxed along with continued sonication. Duration of photoexcitation is largely dependent on the nanoparticles, their size and concentration, and on the particular monomer(s) and tethering agent(s) used.

At process block 334, the reaction is monitored by following the vibration band of —C═C—H bonds at 1628 cm$^{-1}$ using a Fourier-transform infrared (FTIR) spectrometer. Once the band has substantially disappeared (indicating full reaction of all the terminal ethylene groups), the method proceeds to process block 340.

At process block 340, polymerization desirably is performed immediately after photo-mediated shell formation is complete at process block 334. Polymerization can be continued in the same reaction mixture to synthesize the bulk polymer (matrix material) containing the dispersed core-shell nanocomposite particles. For example, 0.25 mL of MMA, 0.2 mL of BMA, 50 μL of TMPTA, and 2 wt % of 2,2'-azobis(2-methylpropionitrile) (AIBN; used as a cross-linking agent) was added to a vessel containing the nanocomposite particles from process block 334, and the mixture was refluxed (e.g., for 6-8 hours) under continuous sonication.

IV. Exemplary Synthesis of $Fe_3O_4$ CORE—PMMA—PBMA—TMPTA Shell Nanocomposites: Two-Step Method FIG. 3B is a flow chart 350 showing an embodiment of a method for preparing NC-PS nanocomposite particles, and for networking these particles in a cross-linked polymer matrix. As discussed above, the method shown in the flow chart 350 can be called a "two-step" method, in which the NC-PS nanocomposite particles are separated from the suspension in which they are formed and then polymerized into the host material in a subsequent (and separate) second step.

At process blocks 360-372, steps similar to those discussed above with respect to process blocks 310-334, respectively, are performed.

At process block 360, $Fe_3O_4$ nanoparticles with desired diameters (e.g., 5, 10, 15, 20, 25 and/or 40 nm) are dispersed in chloroform solvent. Molecules of monomer(s) and of tethering agent(s) are then added to the particle/solvent suspension. Desirably, the monomer(s) and tethering agent(s) are highly soluble in the solvent. Example monomers are methylmethacrylate (MMA) and benzylmethacrylate (BMA). An exemplary tethering agent is trimethylolpropanetriacrylate (TMPTA). In one example, 10 mg of nanoparticles dispersed in 100 mL of chloroform were mixed with 0.25 mL of MMA, 0.2 mL of BMA, and 50 μL of TMPTA.

At process block 362, the mixture is agitated (e.g., by sonication) before being illuminated. Sonication is an agitation technique that disperses the particles and other ingredients thoroughly. For example, the mixture was sonicated for 2 hrs at 65° C. using a bath-type or probe-type sonicator. At process block 370, the mixture is illuminated using a photoexcitation source (e.g., a source producing light having a 360-400 nm wavelength and a nominal power of 10 mW/cm$^2$). The wavelength of the photoexcitation source is selected according to predetermined criteria in which the energy band gap of the nanoparticles is correlated closely with that of the monomer(s) and tethering agent(s) in the suspension. Photoexcitation is continued for a length of time (e.g., 2.5 hours), based on reaction monitoring at process block 372, during which the reaction mixture is refluxed along with continued sonication. Duration of photoexcitation is largely dependent on the particles, their size and concentration, and on the particular monomer(s) and tethering agent(s) used.

At process block 372, the reaction is monitored by following the vibration band of —C═C—H bonds at 1628 cm$^{-1}$ using a Fourier-transform infrared (FTIR) spectrometer. Once the band has substantially disappeared (indicating full reaction of all the terminal ethylene groups), the method proceeds to process block 380. At this stage, formation of the NC-PS nanocomposite particles is complete.

At process block 380, the reaction mixture is cooled (e.g., to room temperature) and subsequently the solvent volume is reduced (e.g., from 100 mL to 20 mL) by, e.g., filtration or centrifugation. The resulting suspension is stable.

At process block 382, the NC-PS nanocomposite particles are separated from the remaining liquid by centrifugation (e.g., at 9×g) and re-dispersed in 20 mL of chloroform, forming a stable suspension of the nanocomposite particles. The observed bench stability of these nanocomposite particles varies between 2 to 4 weeks for some examples.

Process blocks 390 and 392 illustrate two alternative techniques that can be used to synthesize the bulk polymer of the composite system using the stable nanocomposite mixture.

At process block 390, the NC-PS nanocomposite particles isolated at process block 382 are added to a solution of monomer(s), tethering agent(s) if desired or necessary, crosslinking agent (if desired or necessary), and a suitable solvent. The resulting suspension is formed into a polymer-matrix composite material by thermal polymerization. For example, the suspension was diluted to 50 mL with chloroform and sonicated for 2 hours. To carry out the polymerization, 0.25 mL of MMA, 0.2 mL of BMA, 50 µL of TMPTA, and 2 wt % of 2,2'-azobis(2-methylpropionitrile) (AIBN; a crosslinking agent), all of which being dissolved in chloroform, were added to the vessel containing the NC-PS nanocomposite particles and refluxed for 6-8 hours under continuous sonication. Excess amounts of AIBN are usually required to complete the thermal polymerization, especially if the reaction is carried out in ambient conditions and not under an inert atmosphere, for example.

Alternatively, at process block 392, the bulk polymer is synthesized in a single step ("one-pot method") using continuous photo-irradiation. An exemplary composition for such a reaction is 10 mg of nanoparticles dispersed in 100 mL of a chloroform solution of 0.5 mL of MMA, 0.4 mL of BMA, and 100 µL of TMPTA. Photo-irradiation of the resulting mixture was continued for 4 hours.

Regardless of the polymerization techniques employed at process blocks 340, 390, or 392, the average yield of each of these processes has been measured in the range between 80 and 92%.

V. Example Nanocomposite Particles

Figure 4A:
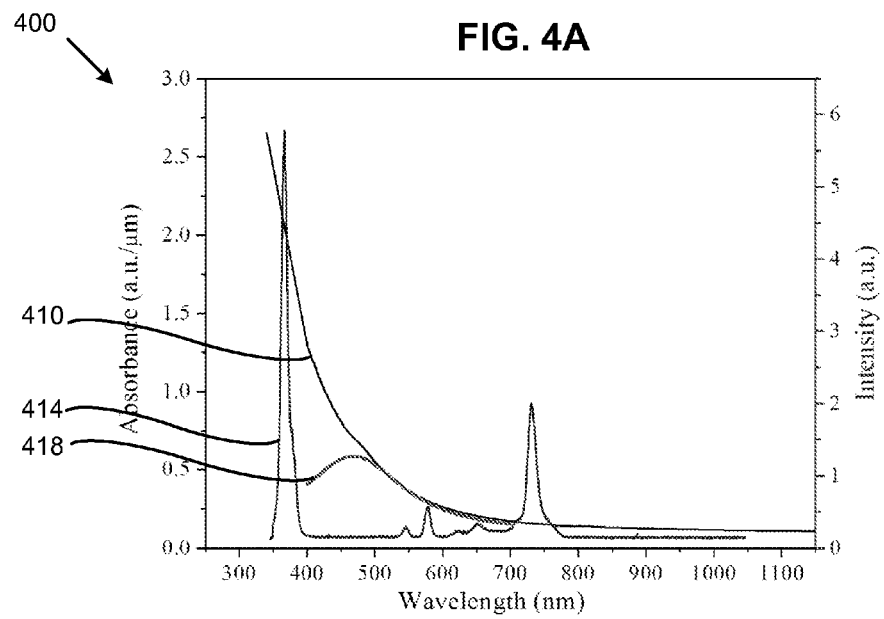
FIG. 4A is a plot depicting the absorption spectrum of a suspension of magnetite nanoparticles in a monomer solution, and of the spectral density of a photoexcitation source used for initiating polymerization.

As noted above, the nanoparticles can be of any of various ferromagnetic materials, including metals and metal oxides. An exemplary ferromagnetic material is magnetite ($Fe_3O_4$). FIG. 4A is a plot 400 depicting a curve 410 indicating the absorption spectrum of 1% (w/w) 15 nm magnetite dissolved in an acrylate monomer mixture, plotted versus wavelength (along the X-axis, in nm) and another curve 414 indicating the spectral density of a 360-400 nm photoexcitation source. Also illustrated is a curve 418 indicating absorption resulting from a possible surface band gap, which is shown deconvoluted from the absorption spectrum. The curves 410 and 418 indicating the absorption spectra are plotted against the left Y-axis, in atomic units (a.u.) per micron (µm), while the curve 414 is plotted against the right Y-axis, in a.u.

Figure 4B:
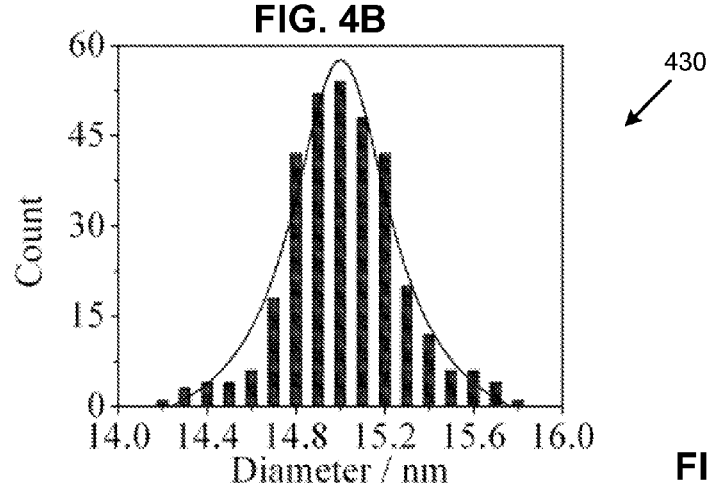
FIG. 4B is a histogram depicting a distribution of nanocomposite shell diameters in an exemplary suspension of NC-PS nanocomposite particles.
Figure 4C:
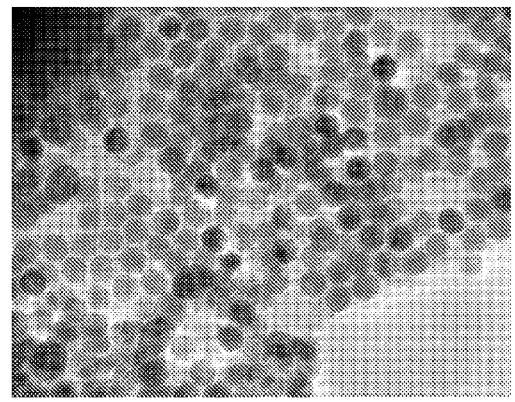
FIG. 4C is a transmission electron microscopy (TEM) image showing NC-PS nanocomposite particles suspended in a polymer matrix.

FIG. 4B is a histogram 430 showing the distribution of diameters for the NC-PS nanocomposite particles depicted in the TEM image 450 in FIG. 4C. As shown, the mode for the data is approximately 52 particles having a diameter of approximately 15 nm.

Figure 5A:
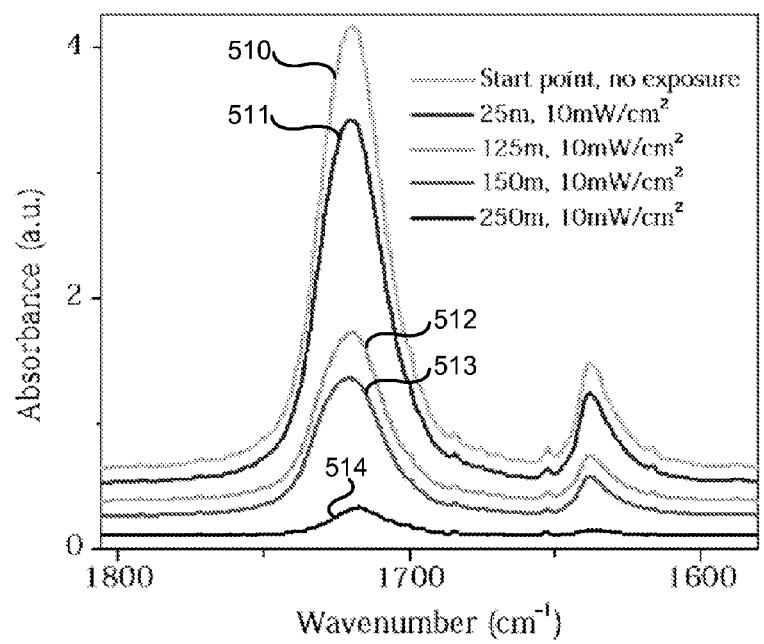
FIG. 5A is a plot depicting the relative absorption of the —C=C—H vibrational band at 1628 $cm^{-1}$ of a suspension of magnetite nanoparticles in a monomer at various points in time while being exposed with a photoexcitation source.
Figure 5B:
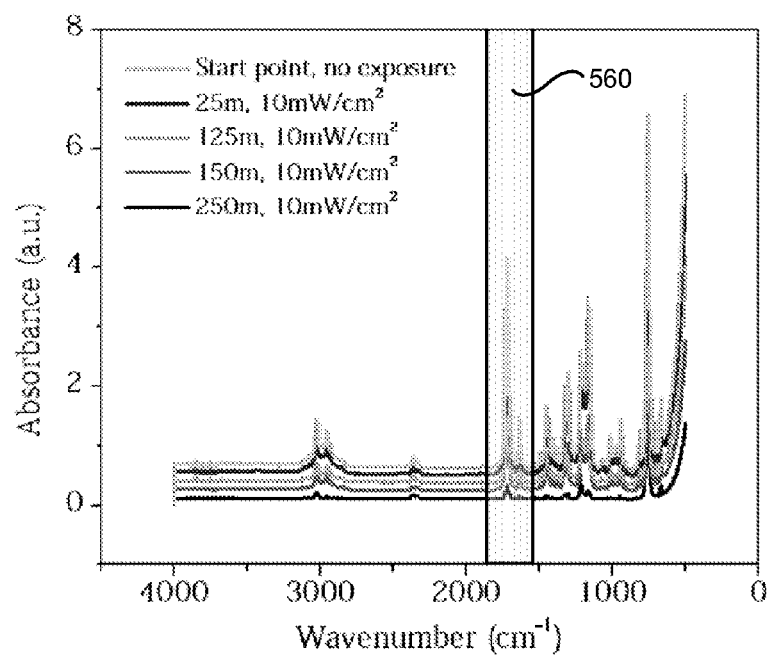
FIG. 5B is a plot corresponding with FIG. 5A, depicting a full Fourier-transformed infrared (FTIR) absorption spectrum of a suspension of magnetite nanoparticles in a monomer at various points in time while being exposed with a photoexcitation source.

FIGS. 5A-5B are plots 500 and 550 showing relative absorption of the —C═C—H vibrational band at 1628 cm$^{-1}$ of $Fe_3O_4$ nanoparticles (5 wt %) and a MMA-TMPTA-BMA mixture in chloroform after different photoexcitation exposure times over a wavenumber range of 1525-1825 cm$^{-1}$. As shown, curves 510, 511, 512, 513, 514 denote the absorption spectra after 25, 125, 150, and 250 minutes of exposure, respectively. As shown, the absorption band at 1628 cm$^{-1}$ decreases by an order of magnitude within 250 minutes of exposure. FIG. 5B is a plot 550 showing the relative absorption for the same mixture and time period, but over a wavenumber range of 0-4000 cm$^{-1}$. The portion of the spectrum shown in FIG. 5A is indicated as a shaded area 560.

VI. Exemplary Alternative Bulk Composite Polymer Systems

Using the approach described above produces an excellent dispersion of NC-PS nanocomposite particles by taking advantage of entropic forces in the initial mixing, as well as of energetic factors after forming the polymer shells, while also allowing the host polymer properties to be substantially varied as desired. A particularly desirable manner of achieving a desired property of the host polymer is by choosing appropriate monomer(s) for its formation. An array of monomers has been tested for both shell formation and host polymer formation, either as a single component or as a cross-linked multi-component composite polymer system. Different monomers that have successfully been used in this method include: methylmethacrylate, methacrylic acid, styrene, benzylmethacrylate, dimethylaminomethacrylate, trimethylolpropanetriacrylate, hexylmethacrylate, iso-butylmethacrylate, 3-(trimethoxysilyl)propylmethacrylate, and vinylmethacrylate. In-situ thermal polymerization of different monomers together in the presence of a suitable cross-linking agent can help prevent phase separation in the final bulk polymer, thereby avoiding the phase separations often seen in physical mixtures of other polymers, such as polystyrene and PMMA, or PMMA and PBMA. The polymer systems disclosed herein also provide extensive ability to control solubility, plasticity, thermal properties, and in particular, refractive indices, a key parameter in fabrication of optical devices. Solubility, plasticity, and thermal and mechanical properties can be controlled using different ratios of crosslinking agent such as TMPTA and hexyl- or iso-butyl methacrylates as monomers.

VII. Exemplary Control of Shell Thickness

The polymer shell thickness can be varied by controlling the amount of tethering agent and/or cross-linking agent and exposure time to the photoactivation light source. Two typical examples of different shell thicknesses are shown in FIGS.

Figure 6A:
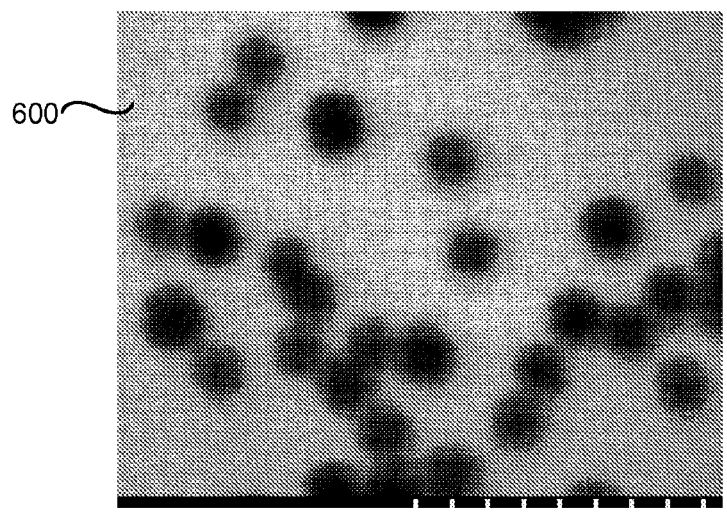
FIGS. 6A-6C are STEMs showing NC-PS nanocomposite particles fixed in a polymer matrix.
Figure 6B:
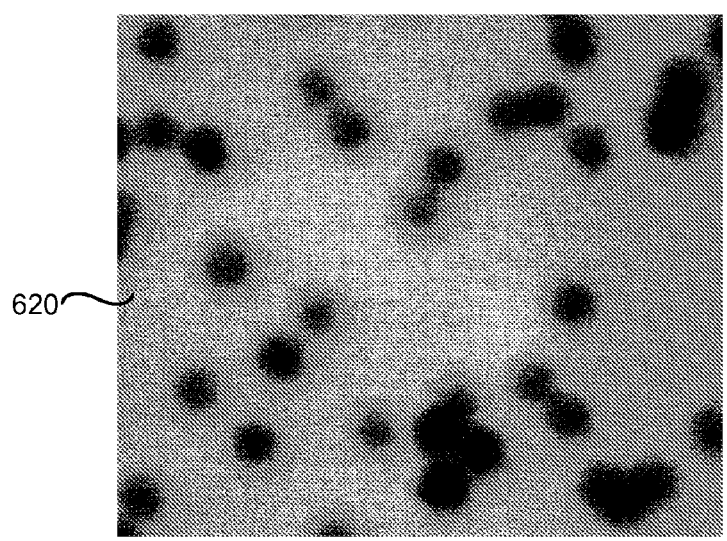
Figure 6C:
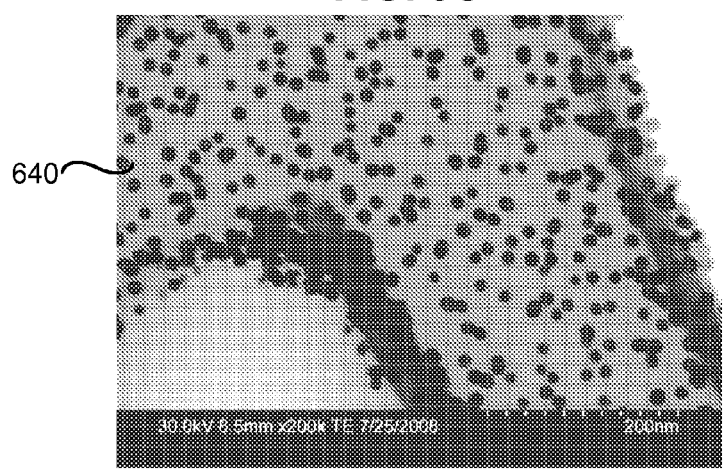

6A-6B. The scanning transmission electron microscopy (STEM) images 600 and 620 show shell thicknesses of 4 nm (FIG. 6A) and 8 nm (FIG. 6B) with shells made of PMMA-PBMA cross-linked with TMPTA on 15-nm $Fe_3O_4$ nanoparticles. The 4-nm shells were prepared using 0.05 wt % TMPTA and 75 minutes of exposure, while the 8-nm shells were prepared using 0.1 wt % TMPTA and 2 hours of exposure. FIG. 6C shows a STEM image 640 of a composite prepared by a one-step method. The shell is not visible in this case, as the host and shell material are identical in composition.

VIII. Exemplary Control of Refractive Index of the Resulting Bulk Polymer

Refractive index (RI) is a key parameter in optical devices and influences the overall performance of the optical device. Therefore it is desirable to be able to control and fine-tune the RI of the final polymer composite incorporating the NC-PS nanocomposite particles, in particular for magneto-optical (MO) device applications. Refractive indices of pure PMMA, PBMA, and PS are 1.4893, 1.5681, and 1.5894, respectively, at 633 nm. By appropriate choice of a suitable ratio of these monomers, for example, it is possible to achieve any RI value between 1.4893 and 1.5894.

Figure 7:
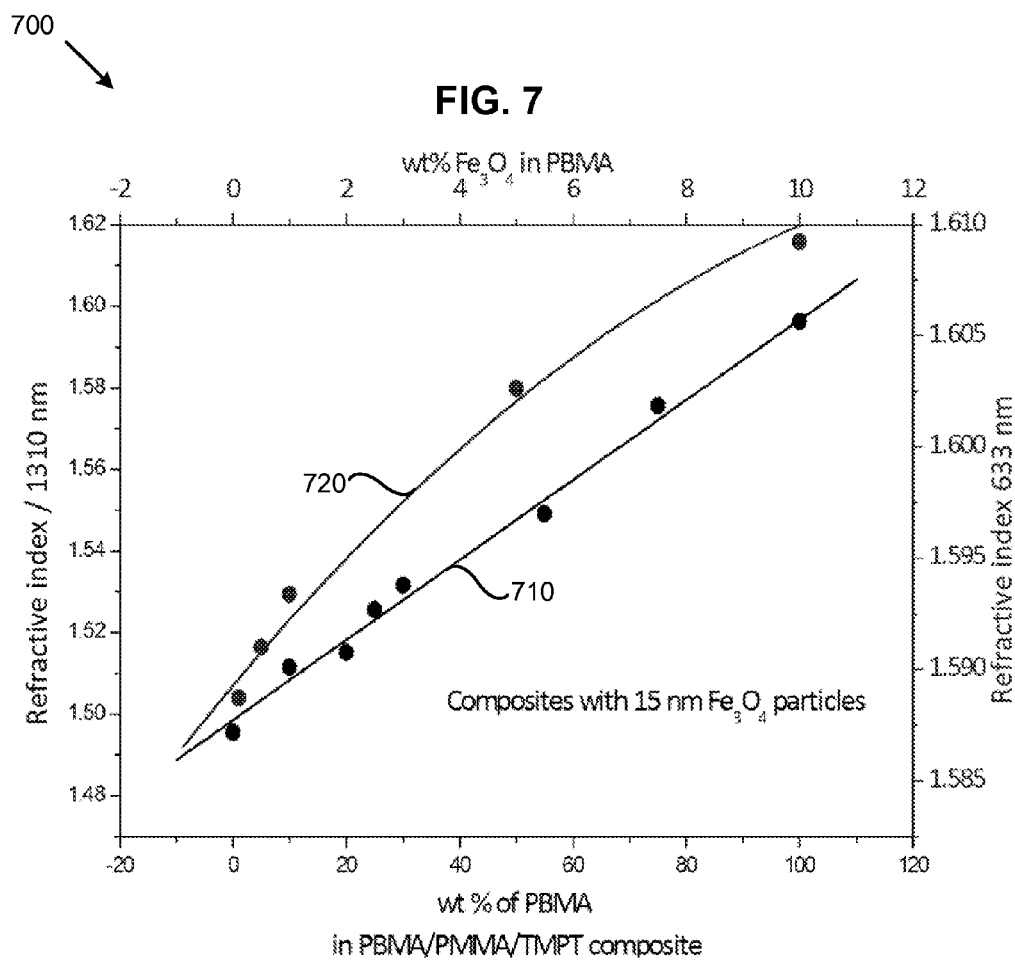
FIG. 7 is a plot depicting refractive index (RI) values vs. concentration of magnetite nanoparticles (top, right scale) and concentration of one of the monomers (bottom, left scale) for two different composites.

FIG. 7 is a plot 700 depicting RI values vs. concentration of magnetite particles for two different composites. The curve 710 (plotted against the left and bottom axes) indicates RI values of a PMMA-TMPTA-PBMA composite polymer containing 5% (w/w) of NC-PS nanocomposite particles each having a 15-nm $Fe_3O_4$ nanoparticle core and a PMMA-TMPTA-PBMA copolymer shell. The data, measured at 1310 nm wavelength, show a linear dependence versus the wt % of PBMA in the composite. The RI can be varied linearly between the PMMA and PBMA RI values. FIG. 7 also shows, along curve 720 (plotted against the right and top axes), RI values of a 15-nm $Fe_3O_4$ nanoparticle core-PBMA shell nanocomposite at different nanoparticle loads, with 10% (w/w) being the maximum concentration shown. The RI values roughly follow Maxwell-Garnet predictions of refractive indices for nanocomposite materials. Using other available monomers, refractive indices along with other required processing parameters can be fine-tuned using the methods disclosed herein.

IX. Exemplary Polymerization Process

Figure 8A:
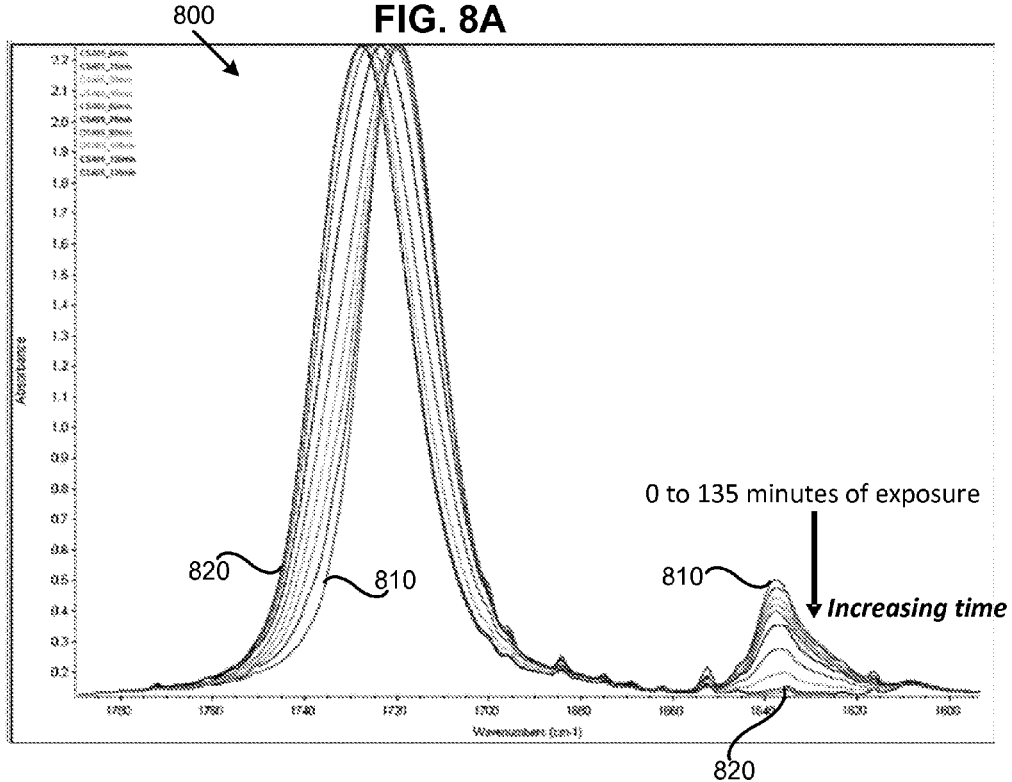
FIGS. 8A and 8B are plots depicting Fourier transformed infrared (FTIR) absorption spectra of a control reaction according to the disclosed technology.
Figure 8B:
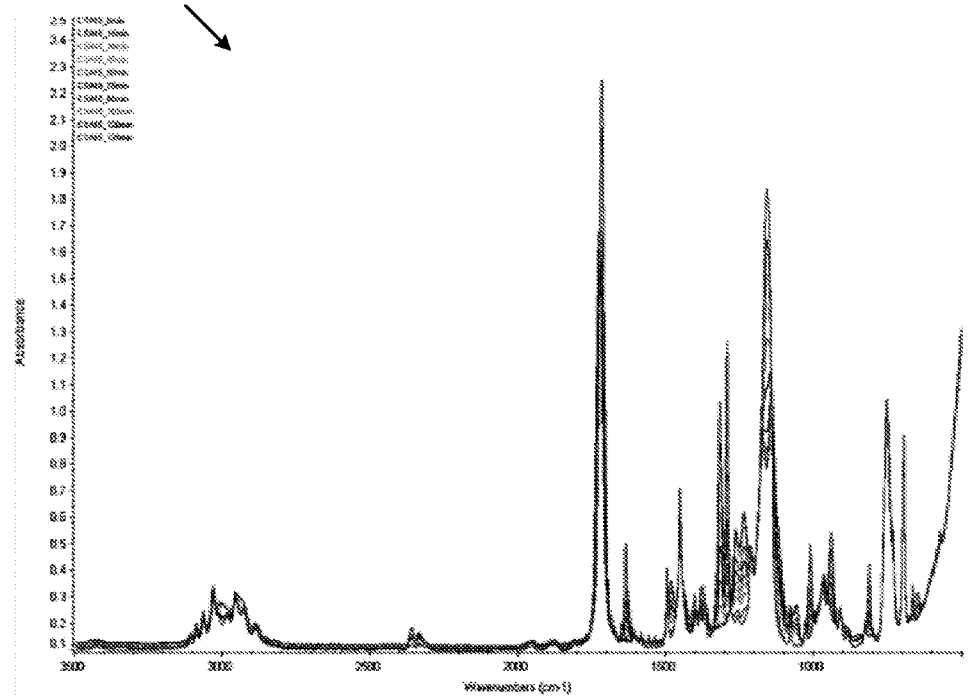

Also disclosed herein is a study of nanoparticle-sensitized photopolymerization of BMA under linear one-photon absorption conditions. Shown in FIGS. 8A and 8B are the results of an investigation of the reaction mixture used in the one-step method, performed using BMA-$Fe_3O_4$ nanoparticles in chloroform. The reaction time was followed using FTIR spectroscopy. Control polymerization experiments were performed without the nanoparticles, using pure inhibitor-free BMA solutions in chloroform under ambient conditions. None of these experiments yielded any measurable amount of polymer, even after 12 hours of exposure at 10 mW/cm$^2$. On the other hand, 100% photopolymerization was observed in illuminated solutions containing BMA monomers and commercially available as-received $Fe_3O_4$ nanoparticles. FIG. 8A is a plot 800 depicting FTIR spectra of the control reaction over wavenumbers of approximately 1600-1800 cm$^{-1}$ over a 135 minute time period. As shown, curve 810 indicates the spectra at the start of the control reaction and curve 820 indicates the spectra after 135 minutes of exposure. FIG. 8B depicts the same FTIR spectra of the control reaction as FIG. 8A, but plotted over a wavenumber range of approximately 400-3600 cm$^{-1}$. Also of note is that the reaction mixture did not contain any polymerization co-initiator. In some embodiments the photopolymerization process linearly depends on the illumination power, and is also dependent on nanoparticle size. These observations confirm that the photo-induced polymer shell formation process is surface-mediated and nanoparticle-induced.

X. Exemplary Film Fabrication for Magneto-Optic Measurements

NC-PS composites with different concentrations of nanoparticles were prepared with magnetite particles having 15 nm and 40 nm diameters in independent batches by appropriately adjusting the weight ratio of the particles to the total weight of the acrylates used. Faraday Rotation (FR) studies were conducted on representative examples including polymer nanocomposite systems with 15 nm particles having 1 and 5 wt % loading (hereinafter, polymers A and B respectively), and 40 nm particles with 0.5 and 1 wt % loading (hereinafter, polymers C and D respectively).

Figure 9A:
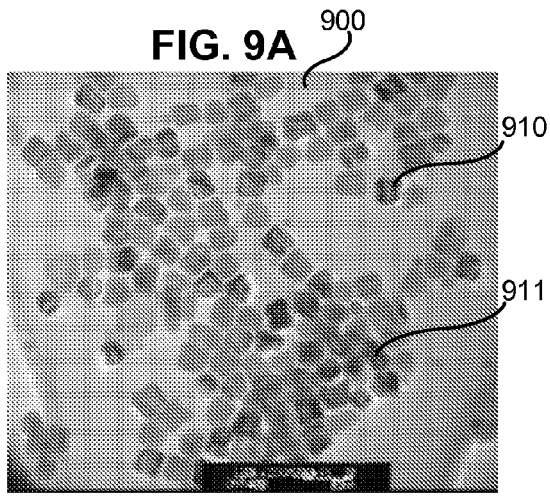
FIG. 9A is a TEM image of anisotropic 40-nm magnetite nanoparticles used in the disclosed technology.
Figure 9B:
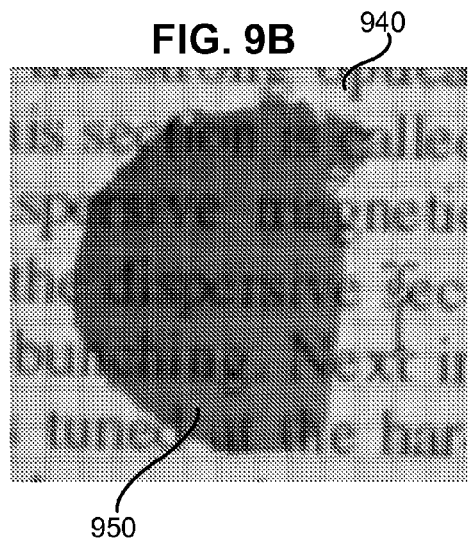
FIG. 9B is a photograph of a free-standing 53 µm thick film of D corresponding to the absorption spectrum shown in FIG. 9C.
Figure 9C:
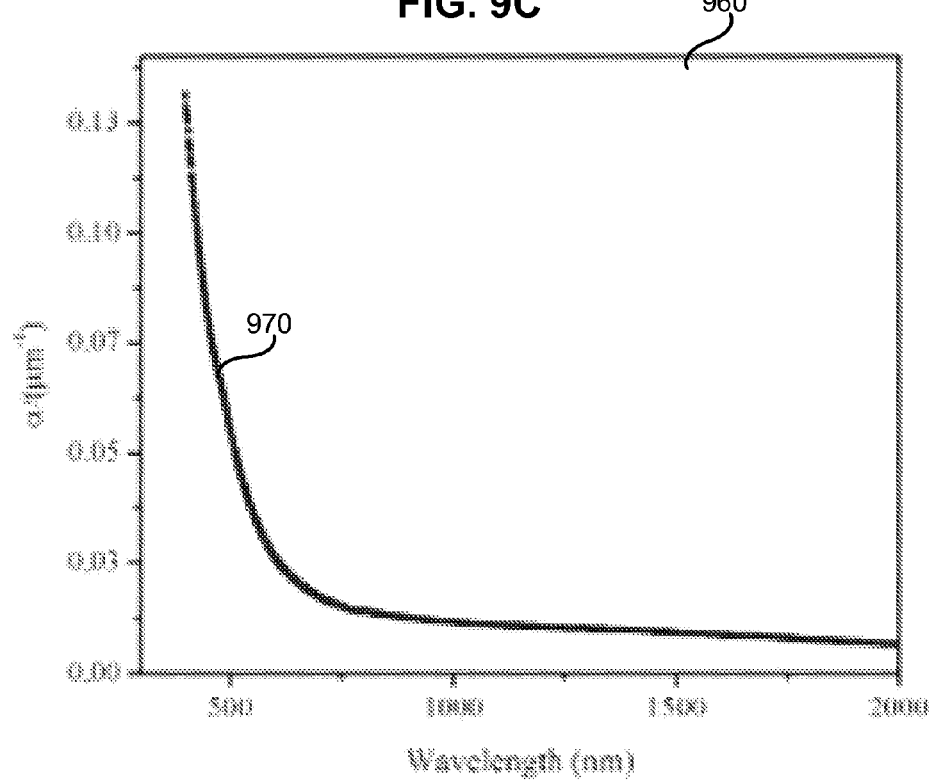
FIG. 9C is a plot of the absorption spectra of a 53-µm film of a 1% (w/w) composite film (film C) of anisotropic 40-nm magnetite nanoparticles formed according to the disclosed technology.

Concentrations of Fe in the bulk composites were verified using inductively-coupled plasma atomic emission analysis. Both transmission electron microscopy (TEM) and scanning transmission electron microscopy (STEM) can be used to examine the magnetite nanoparticles themselves and the resulting composites. FIG. 9A shows a TEM image 900 of anisotropic 40 nm magnetite nanoparticles (e.g., core-shell nanocomposite particles 910 and 911) used in the synthesis of composite C formed according to the disclosed technology. FIG. 9C is a plot 960 of the absorption spectra along curve 970 of a 53-μm film of a 1% (w/w) composite film of anisotropic 40 nm magnetite nanoparticles formed according to the disclosed technology. The $Fe_3O_4$ nanoparticles in polymers A, B, C and D each had a shell of average thickness of 5 nm. The final nanocomposite polymers were melt-processed to prepare free-standing films for all FR measurements. FIG. 9B is a photograph 940 of such a free-standing 53 μm thick film 950 of polymer D corresponding to the absorption spectrum of FIG. 9C, which clearly shows the high transparency achieved in these films. The high transparency is highly desirable because it allows application of the final nanocomposite polymers in a wide variety of magneto-optical applications, including magnetic field sensors, optical devices, and information storage.

XI. Experimental Results Measuring Magneto-Optical Faraday Rotation (FR)

FR measurements are a useful method of evaluating MO properties of various nanocomposite materials formed according to the subject method. FR data have applicability for use of the materials for optical isolation devices and magnetic field sensors, for example. FR measurements were performed using AC and DC magnetic field in a geometry with k, B∥z, where the FR angle is defined as $$\theta = VBL = \pi \frac{\Delta n}{\lambda} L \quad (1)$$

where Δn is the magnitude of circular birefringence (i.e., $n_{LCP}$- $n_{RCP}$) experienced by the medium under the applied magnetic field B, λ, is the wavelength of light and L is the length of the medium. The constant V, the Verdet constant (expressed in degree/Tesla-meter) is a materials property and a quantitative measure of the FR ability of the material. Details of the AC FR measurement setup can be found in Gangopadhyay et al., "Faraday Rotation Measurements on Thin Films of Regioregular Alkyl-Substituted Polythiophene Derivatives," *J. Phys. Chem. C*, Vol. 112, page 8032 (2008) (hereinafter "*Gangopadhyay*"), the disclosure of which is incorporated herein by reference in its entirety.

Six lasers were employed to provide for measurements at wavelengths of 532 nm, 632.8 nm, 670 nm, 980 nm, 1310 nm, and 1550 nm. This range spans the electromagnetic spectrum from the visible through the telecommunications range. For DC FR measurements, a similar differential polarization-sensitive detection protocol as described in *Gangopadhyay* was used in tandem with a polarization modulation technique using an electro-optic polarization modulator. A solid state 980 nm diode laser was used for the DC measurements. Both AC and DC Faraday rotation measurements have<10% experimental error. Faraday rotation in this class of composites is strongly dependent on the surface properties of the particles and on the characteristics of the surrounding dielectrics. The close proximity of the PMMA shell and the resulting dielectric effects on the $Fe_3O_4$ particles play a significant role in determining the resulting magneto-optic response. In homogeneous bulk material, FR originates from the complex off-diagonal elements $\sigma_{xy}=\sigma_{1xy}+i\sigma_{2xy}$ of the optical conductivity tensor, as well as from the diagonal elements $\sigma_{xx}=\sigma_{1xx}+i\sigma_{2xx}=-i\omega(1-\epsilon_{xx})/4\pi$ as follows:

$$\theta_F = -\frac{2\pi l_0}{c}\frac{n\sigma_{1xy}-k\sigma_{2xy}}{n^2+k^2} \quad (2)$$

and $\epsilon_{1xx}=n^2-k^2$ and $\epsilon_{2xx}=2nk$, where $\theta_F$ is the FR angle for material thickness $l_0$; $\epsilon_{1xx}$ and $\epsilon_{2xx}$ are the real and imaginary parts of the diagonal elements of the dielectric tensor; and n and k are the refractive index and absorption coefficients, respectively. The strong dependence of $\theta_F$ on the optical constants n and k suggests that the nature of the polymer shell plays a key role in the behavior of these magneto-optic (MO) active nanocomposite materials.

Figure 10:
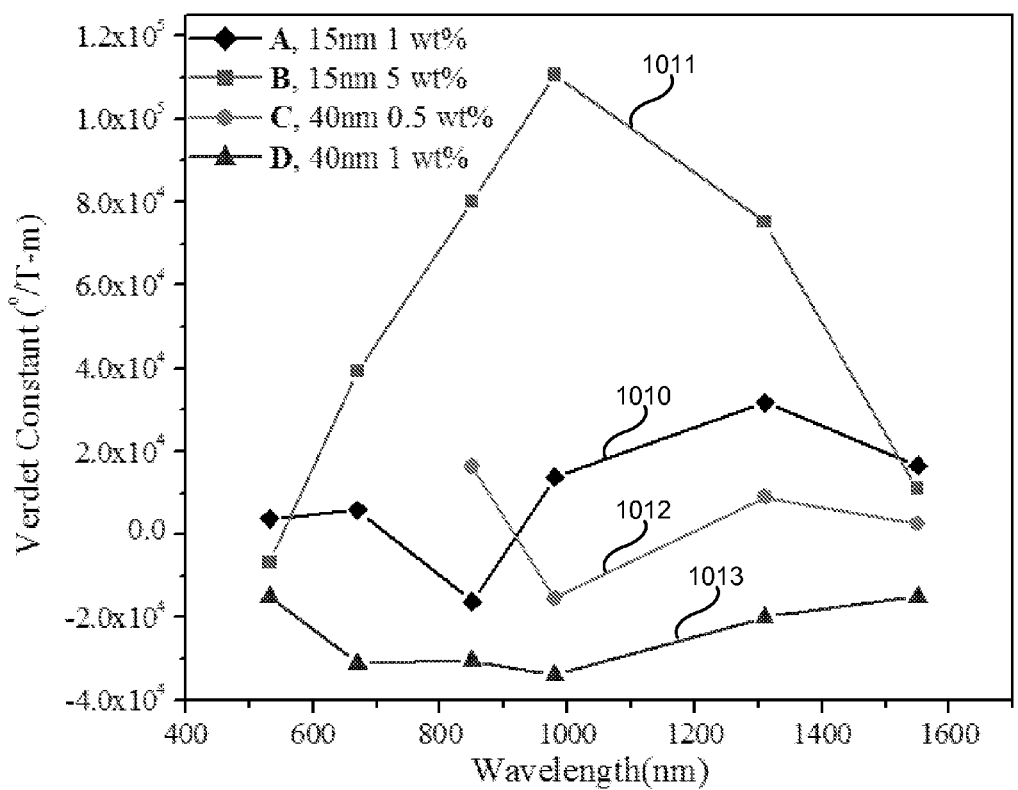
FIG. 10 is a plot depicting a comparison of the wavelength-dependent Verdet constants for four different polymer nanocomposites.

FIG. 10 is a plot 1000 depicting a comparison of the wavelength-dependent Verdet constants for the polymer nanocomposites A, B, C, and D (curves 1010, 1011, 1012, and 1013, respectively). Within the wavelength range investigated, the FR magnitude and sign of A, C, and D are comparable, with a saturation field between 50 and 60 mT. This similarity is regarded as arising from the dominant effects of the $Fe_3O_4$ interband transitions on the diagonal and off-diagonal terms of the magneto-optical tensor in the absorptive region. Away from resonance, the FR magnitudes of these composites are dependent upon their net bulk magnetizations and are accordingly similar. The cross-over region of the FR sign is generally consistent with data reported in Yusuf et al., "The Wavelength Dependence of Faraday Rotation in Magnetic Fluids," *J. Appl. Phys.* Vol. 64, No. 5, pp. 2781-2782 (1988), and Pan et al., "Wavelength Dependence of the Faraday Effect and Magnetobirefringence in Ferrofluid Thin Films," *J. Appl. Phys.*, Vol. 73, No. 10, pp. 6139-6141 (1993).

The inter-nanoparticle distances are too large to result in any strong interparticle magnetic interactions that may influence their relative ordering and hence magneto-optic response. However, the Verdet constant of B shows a strong enhancement within the near infrared wavelength region, in particular at 980 nm. The FR magnitude was observed to increase with increasing concentration of particles, maximizing for B and D and decreasing when the concentration was further increased (data not shown). Such behavior is unusual since the MO response and the Verdet constants in $Fe_3O_4$ are usually linearly proportional to the nanoparticle concentration, even at much larger concentrations than reported here. These largely non-aggregated nearly monodispersed core-shell nanoparticles may participate in long-range magnetic interactions resulting in a synergistic MO response.

It is possible to investigate interparticle interactions by analyzing the FR angle and fitting a suitably modified Langevin function to data measured using a DC magnetic field. The Langevin function classically describes an ensemble of non-interacting paramagnets. Deviations from the Langevin shape indicate the presence and nature of the magnetic coupling between the particles. The bulk magnetization value of magnetite can be used to estimate the size of the magnetically-active core of the nanoparticles. The analysis is shown in the charts 1100 and 1150 depicted in FIGS. 11A and 11B, where the FR data as a function of applied DC magnetic field is shown together with a fitted Langevin function. As shown, curves 1110, 1120, 1160, and 1170 correspond to polymers A, B, C, and D, respectively.

Figure 11A:
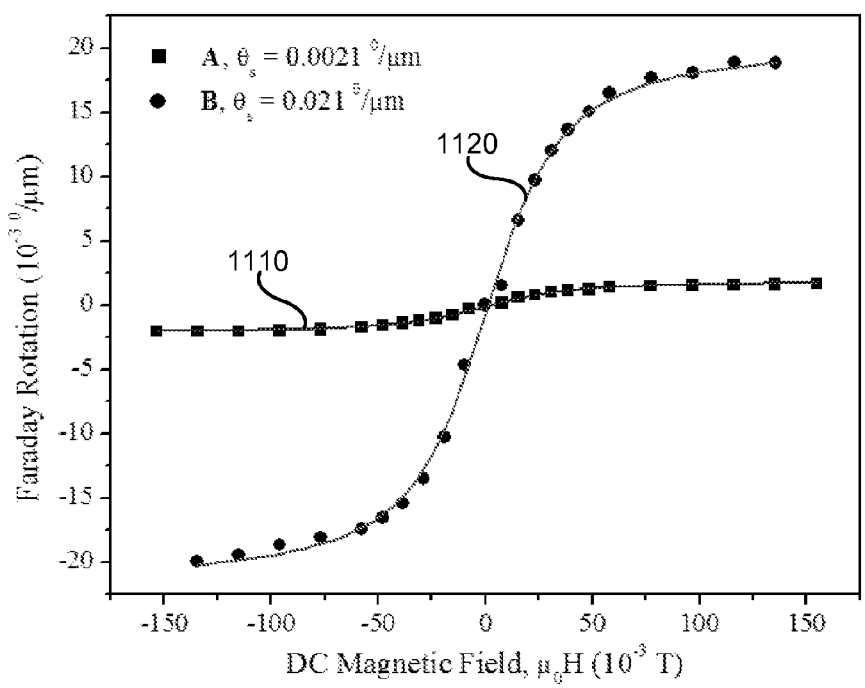
FIGS. 11A and 11B are respective plots depicting the MO Faraday rotations exhibited by two polymer nanocomposites in a DC magnetic-field at a laser wavelength of 980 nm.
Figure 11B:
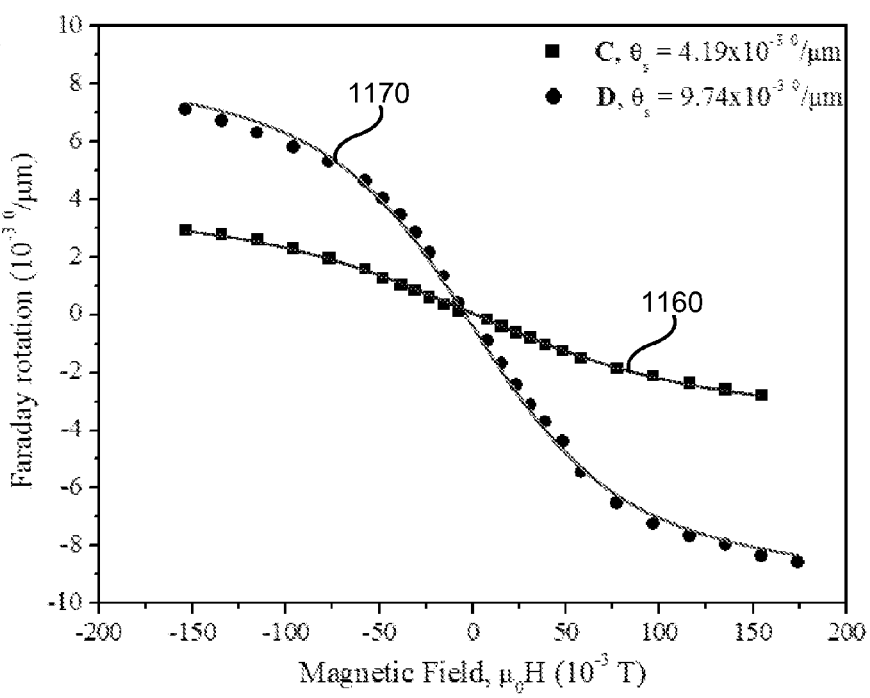

The fitted Langevin function describes assemblies of particles with freely-rotating moments:

$$m(H,T) = \sum_i N_i m_i \left[ \coth\left(\frac{\mu_0 m_i H}{k_B T}\right) - \frac{k_B T}{\mu_0 m_i H} \right] \quad (3)$$

where $N_i$ specifies the number of non-interacting particles per unit volume with moment $m_i$ and the sum includes all groups of particles with a given moment, where H is the applied magnetic field, T is the sample temperature, and $k_B$ is the Boltzmann constant. Since $$\frac{\theta_F^S}{\theta_F^S} = k\frac{M}{M_S} \quad (4)$$

where $\theta_F^S$ is the FR at the saturation magnetization $M_s$ and k is an appropriate constant; the FR data in FIGS. 11A and 11B were fitted with $$\theta_F = k\theta_F^S\left(\coth A\mu_0 H - \frac{1}{A\mu_0 H}\right) - C' \quad (5)$$

and generally, for a given particle size we expect $\theta_{F1}^S/\theta_{F2}^S = N_1/N_2$. The Langevin shape indicates that the longitudinal FR is induced by spatial reorganization of the magnetic moments within the particles (partially countered by thermal agitation) similar to magnetization. The Verdet constants calculated from the slope with $$\left(\frac{d\theta_F}{dB}\right)_{B\to 0},$$

are within 5% of the values measured using the AC magnetic field shown in FIG. 10. The parameter C' was added to account for the contribution of the polymer host matrix towards the MO response of the composites. The parameter C' need not be directly correlated with the MO response of the inert polymer host, but is rather an estimate of any cumulative magnetic interaction present in the nanocomposite material. Note that the Langevin shapes for all four polymer composites are asymmetric with different magnitudes of saturated FR at positive and negative saturation fields. Fits were obtained with adjusted $\chi^2>0.999$, and the errors of the fits were within the limits of experimental errors. Assuming the magnetic moment for bulk $Fe_3O_4$ as 2.4 $\mu_B$, one obtains an effective magnetic moment size of 13.7 nm for polymer A. Similarly, one obtains an effective magnetic moment size of 32.7 nm for polymer C'. The diameters of the core particles used are consistent with TEM measurements. Although, $\theta_{FC}^S/\theta_{FD}^S \approx N_C/N_D$, the ratio of the saturation FR between polymers A and B is two times larger than the ratio of the nanoparticle concentrations. The fact that $\theta_{FB}^S/\theta_{FA}^S > N_B/N_A$ provides evidence that there exist long-range magnetic interactions in B. Furthermore, the parameter C' appears to be strongly related to the concentration of the nanoparticles. The MO responses of pure and doped magnetite nanoparticles are strongly dominated by two paramagnetic-type intervalence charge transfer bands at 0.6 and 1.9 eV. It can be reasonably expected that the oscillator strengths and intensities of these transitions and their relative contribution to the resultant MO activity would be particle-size-dependent and significantly different in a strongly interacting system such as B. A different size dependent contribution would also explain the difference in sign in FR between particles with 15 nm and 40 nm diameter. The MO figure of merit (FOM=$2\theta_F^S/\alpha$) of B of 2.1° at 60 mT and 980 nm is comparable with the FOM of 4.2° at 160 mT for yttrium iron garnet, among the best of conventional crystalline MO materials.

XII. Example Applications Using Nancomposite Polymers

MO-active nanocomposites have utility in various devices including, but not limited to, magnetic field sensors, integrable optical isolators and rotators, high-speed MO modulators, and information-storage devices. Examples of MO-active nanocomposites in magnetic field sensors may be found in Day et al., "Faraday Effect Sensors The State of the Art," *Proc. SPIE*, Vol. 985, pg. 138 (1988). Examples of MO-active nanocomposites in MO modulators may be found in *Applied Magnetism*, NATO ASI Series E., Vol. 253 (Gerber et al., eds.) (Kluwer Academic, Dordrecht, 1994). Examples of MO-active nanocomposites in information storage applications may be found in Buchanan et al., "Magnetization Dynamics of Interacting Iron Nanocrystals in $SiO_2$," Phys. Rev. B, Vol. 70, pg. 174436 (2004). A suitably synthesized MO-active nanocomposite would be expected to supplant and extend the role of existing crystalline MO materials. In particular, while conventional application such as bulk optical isolators and sensors are envisioned, applications for MO nanocomposites with very high Verdet constants include ultracompact optical isolators for silicon photonics, picoTesla to femtoTesla magnetic field sensors for medical imaging applications, and ultrahigh density MO storage, to name a few.

Figure 12A:
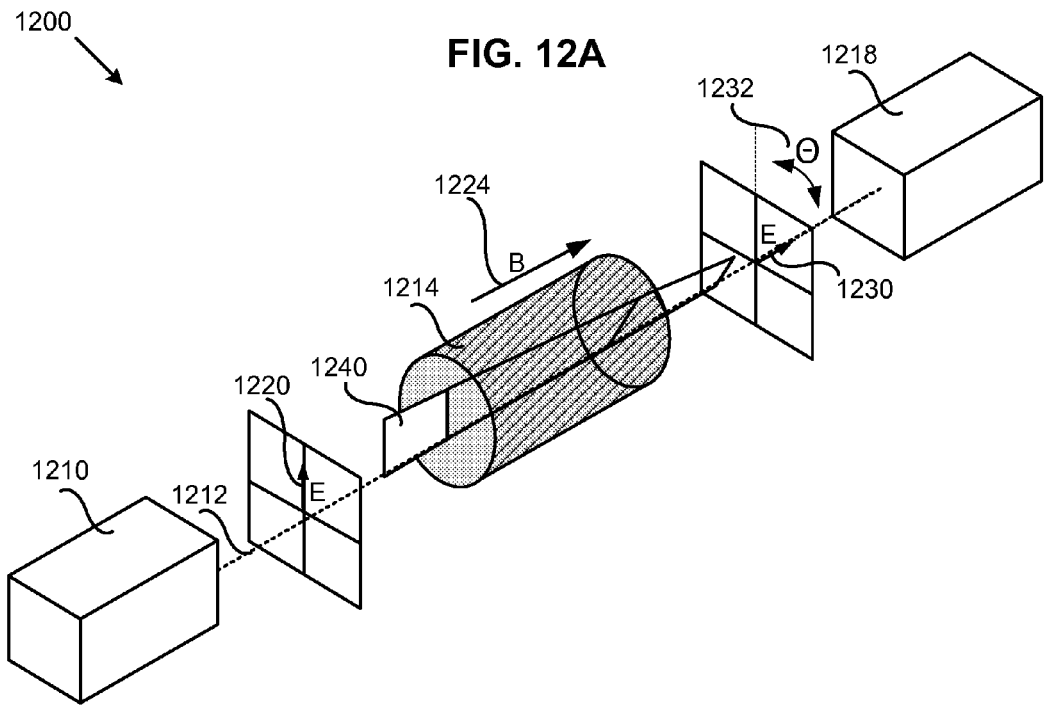
FIG. 12A is a block diagram of an exemplary MO magnetic-field sensor comprising the disclosed nanocomposite materials.

FIG. 12A is a block diagram 1200 illustrating a magnetic field sensor constructed to utilize a nanocomposite formed according to the disclosed technology. As shown, a laser 1210 emits a polarized light beam 1212 into a portion of a magnetite-core polymer-shell nanocomposite 1214. The beam 1212 travels through the nanocomposite 1214 and is received at a photodetector 1218. As shown by an arrow 1220, the electric field component of the beam is oriented at 0 degrees before entering the nanocomposite 1214. Upon the beam passing through the nanocomposite 1214, the orientation of the electric field is rotated as indicated by the plane 1240, arrow 1230, and angle (θ) 1232, indicating the orientation of the electric field component of the beam after leaving the nanocomposite 1214. Meanwhile, magnetic field 1224 to be measured is applied to the nanocomposite 1214. Changes in intensity of the magnetic field 1224 can be detected by measuring changes in the resulting angle of the E field using the photodetector 1218.

Figure 12B:
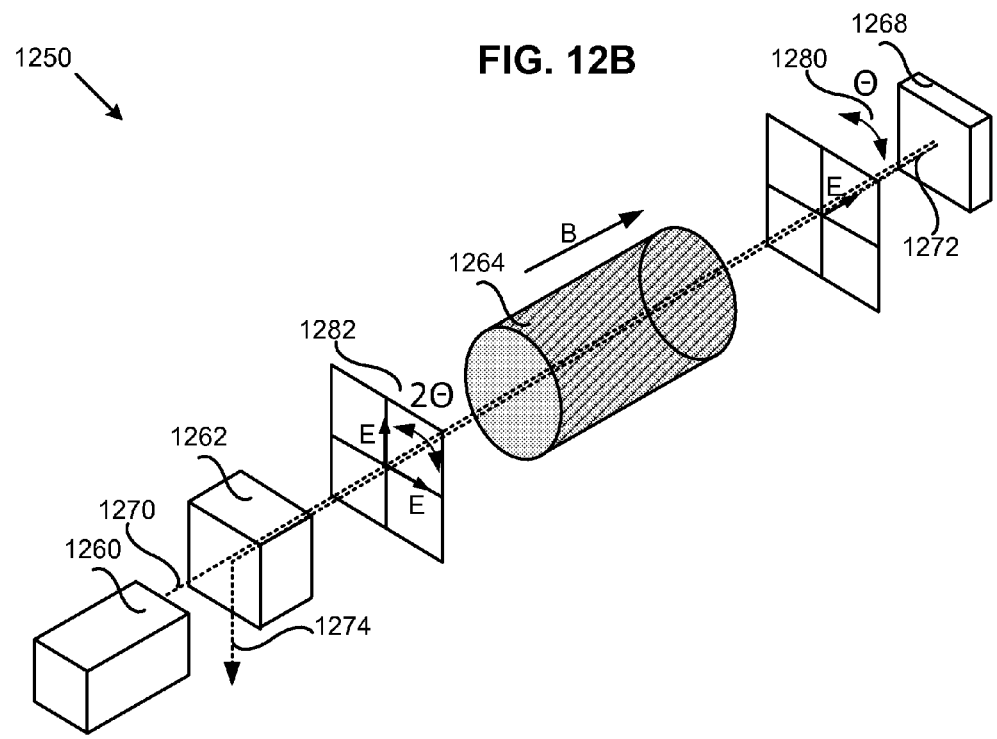
FIG. 12B is a block diagram of an exemplary MO isolator comprising the disclosed nanocomposite materials.

FIG. 12B is a block diagram 1250 illustrating an optical isolator constructed to utilize a nanocomposite formed according to the disclosed technology. As shown, a laser 1260 is used to emit a light beam 1270 through a polarizer 1262. The light beam then travels through a nanocomposite 1264, formed according to the disclosed technology, and is reflected off the minor 1268. The composition, length, shell properties, etc., of the nanocomposite 1264 are selected such that the electric field component of the beam is rotated 45 degrees on a first pass through the nanocomposite, and then rotated an additional 45 degrees when passing back through the nanocomposite after being reflected from the mirror. As shown, the light beam travels through the nanocomposite 1264 back to the polarizer, where the light beam 1274 is reflected at an orthogonal angle to the original light beam 1270.

Having described and illustrated the principles of our innovations in the detailed description and accompanying drawings, it will be recognized that the various embodiments can be modified in arrangement and detail without departing from such principles.

In view of the many possible embodiments to which the principles of our invention may be applied, we claim as our invention all such embodiments as may come within the scope of the following claims and equivalents thereto.

We claim:

1. A method, comprising:
preparing a mixture comprising metal, metal oxide, and/or semi-metallic nanoparticles and molecules of at least one monomer dispersed in a solvent, each nanoparticle having a surface and being insoluble in the solvent, the nanoparticles having a valence to conduction energy band gap of a similar magnitude as a highest occupied molecular orbital (HOMO) to lowest unoccupied molecular orbital (LUMO) energy band gap of the at least one monomer, the valence band of the nanoparticles being aligned with or above at least one HOMO or LUMO energy level of the at least one monomer;
allowing molecules of the at least one monomer to associate with the surfaces of the nanoparticles; and
exposing the mixture to ultraviolet and/or visible light having at least one wavelength selected to photoactivate the surfaces of the nanoparticles and the molecules of the at least one monomer, the at least one wavelength being in a range of 360-600 nm and being selected to excite generation of bound electron-hole pairs when the light is absorbed on the exposed surfaces of the nanoparticles and on the associated monomer molecules, thereby to preferentially induce covalent bonding of molecules of the at least one monomer to the surfaces of the nanoparticles and to each other on the surfaces, thereby forming polymer shells on the surfaces of the nanoparticles to form a suspension of nanoparticle-core polymer-shell nanocomposite particles.

2. The method of claim 1, further comprising:
during exposing the mixture, monitoring a characteristic of unreacted molecules of the at least one monomer to determine an extent of bonding of the molecules to the surfaces of the nanoparticles; and
when the bonding reaches a desired extent, stopping the exposing.

3. The method of claim 2, wherein monitoring comprises spectrophotometrically measuring a vibration band of an active group on the molecules that is consumed as the molecules become covalently bonded to the surface of the nanoparticles.

4. The method of claim 1, further comprising agitating the mixture during at least a portion of the exposing.

5. The method of claim 1, wherein preparing the mixture further comprises adding molecules of at least one tethering agent to the mixture, along with the molecules of the at least one monomer.

6. The method of claim 5, wherein the light includes at least one wavelength selected also to photoactivate the molecules of the tethering agent, to induce also covalent bonding of molecules of the tethering agent to the surfaces of the nanoparticles, to the molecules of the at least one monomer, and to each other on the surfaces.

7. The method of claim 1, further comprising cross-linking the nanoparticle-core polymer-shell nanocomposite particles to a bulk polymer, to form a cross-linked polymer nanocomposite matrix comprising the nanocomposite particles.

8. The method of claim 7, wherein the cross-linked nanocomposite matrix is formed, after substantially completing formation of the polymer shells, by exposing the suspension to a reaction-inducing condition to cross-link unreacted molecules of the at least one monomer to form a matrix material in which the nanoparticle-core polymer-shell nanocomposite particles are cross-linked to the matrix material.

9. The method of claim 8, wherein the reaction-inducing condition is a thermal condition favoring thermal polymerization of the unreacted molecules.

10. The method of claim 8, wherein the reaction-inducing condition comprises exposing the suspension to electromagnetic radiation.

11. The method of claim 10, wherein the electromagnetic radiation has a frequency that is different from the light used during the exposing of the mixture.

12. The method of claim 7, further comprising:
adding molecules of a second monomer to the suspension of nanoparticle-core polymer-shell nancomposite particles; and
exposing the suspension to a reaction condition favoring cross-linking of the molecules of the second monomer to each other and to the nanocomposite particles.

13. The method of claim 12, further comprising agitating the mixture while exposing the suspension to the reaction-favoring condition.

14. The method of claim 12, wherein the reaction-favoring condition comprises photo-activation using a predetermined wavelength of electromagnetic radiation.

15. The method of claim 12, wherein the reaction-favoring condition comprises a predetermined thermal condition.

16. The method of claim 1, wherein the ferromagnetic nanoparticles include $Fe_3O_4$ nanoparticles.

17. The method of claim 1, wherein the monomers are selected from a group consisting of one or more of: methylmethacrylate, methacrylic acid, styrene, benzylmethacrylate, dimethylaminomethacrylate, trimethylolpropanetriacrylate, hexylmethacrylate, iso-butylmethacrylate, 3-(trimethoxysilyl)propylmethacrylate, vinylmethacrylate, and mixtures thereof.

18. The method of claim 1, wherein the mixture is prepared to comprise at least one polymerization inhibiter to control thickness of the polymer shells formed during exposing the mixture.

19. The method of claim 1, wherein exposing the mixture comprises exposing for a preselected time to control thickness of the polymer shells formed during exposing the mixture.

20. A nanocomposite material manufactured by the method of claim 1.

21. A magneto-optical device, comprising the nanocomposite material recited in claim 20.

22. A method, comprising:
selecting a desired refractive index for a cross-linked polymer nanocomposite;
selecting at least one monomer to provide the cross-linked polymer nanocomposite with the desired refractive index;
preparing a mixture comprising metal, metal oxide, and/or semi-metallic nanoparticles and molecules of the at least one monomer dispersed in a solvent, each nanoparticle having a surface and being insoluble in the solvent, the nanoparticles having a valence to conduction energy band gap of a similar magnitude as a highest occupied molecular orbital (HOMO) to lowest unoccupied molecular orbital (LUMO) energy band gap of the at least one monomer, the valence band of the nanoparticles being aligned with or above at least one HOMO or LUMO energy level of the at least one monomer;
allowing molecules of the at least one monomer to associate with the surfaces of the nanoparticles;
exposing the mixture to ultraviolet and/or visible light in a range of 360-600 nm and having at least one wavelength selected to photoactivate the surfaces of the nanoparticles and the molecules of the at least one monomer, the at least one wavelength being selected to excite generation of bound electron-hole pairs when the light is absorbed on the exposed surfaces of the nanoparticles and on the associated monomer molecules, thereby to preferentially induce covalent bonding of molecules of the at least one monomer to the surfaces of the nanoparticles and to each other on the surfaces, thereby forming polymer shells on the surfaces of the nanoparticles to form a suspension of nanoparticle-core polymer-shell nanocomposite particles; and
cross-linking the nanoparticle-core polymer-shell nanocomposite particles to a bulk polymer, to form the cross-linked polymer nanocomposite comprising the nanocomposite particles.

23. A magneto-optical device, comprising the nanocomposite matrix comprising polymer-shelled nanoparticles recited in claim 7.

24. The magneto-optical device of claim 23, selected from the group consisting of magnetic field sensors, optical rotators, magneto-optical modulators, optical isolators, and optical data-storage devices.

25. A method, comprising:
preparing a mixture comprising nanoparticles and molecules of at least one monomer dispersed in a solvent, each nanoparticle having a surface and being insoluble in the solvent;
allowing molecules of the at least one monomer to associate with the surfaces of the nanoparticles; and
forming a polymer shell on the surfaces of the nanoparticles by exposing the mixture to electromagnetic radiation having at least one wavelength in a range of 360-600 nm, the at least one wavelength being selected to excite generation of holes across an energy band gap of the nanoparticles having a similar magnitude as an energy band gap of the at least one monomer, thereby inducing covalent bonding of molecules of the at least one monomer to each other and to the surfaces of the nanoparticles, thereby forming a substantially uniform suspension of nanoparticle-core polymer-shell nanocomposite particles.

26. The method of claim 25, further comprising exposing the suspension to a reaction-inducing condition to cross-link unreacted molecules of the at least one monomer to form a matrix material in which the nanoparticle-core polymer-shell nanocomposite particles are cross-linked to the matrix material.

27. A method, comprising:
preparing a mixture comprising metal, metal oxide, and/or semi-metallic nanoparticles and molecules of at least one monomer dispersed in a solvent, each nanoparticle having a surface and being insoluble in the solvent, the nanoparticles having a valence to conduction energy band gap of a similar magnitude as a highest occupied molecular orbital (HOMO) to lowest unoccupied molecular orbital (LUMO) energy band gap of the at least one monomer, the valence band of the nanoparticles being aligned with or above at least one HOMO or LUMO energy level of the at least one monomer;
allowing molecules of the at least one monomer to associate with the surfaces of the nanoparticles;
exposing the mixture to ultraviolet and/or visible light having at least one wavelength selected to photoactivate the surfaces of the nanoparticles and the molecules of the at least one monomer, the at least one wavelength being selected to excite generation of bound electron-hole pairs when the light is absorbed on the exposed surfaces of the nanoparticles and on the associated monomer molecules, thereby to preferentially induce covalent bonding of molecules of the at least one monomer to the surfaces of the nanoparticles and to each other on the surfaces, thereby forming polymer shells on the surfaces of the nanoparticles to form a suspension of nanoparticle-core polymer-shell nanocomposite particles; and
cross-linking the nanoparticle-core polymer-shell nanocomposite particles to a bulk polymer, to form a cross-linked polymer nanocomposite matrix comprising the nanocomposite particles, the cross-linked nanocomposite matrix being formed, after substantially completing formation of the polymer shells, by exposing the suspension to a reaction-inducing thermal condition favoring thermal polymerization of the unreacted molecules to cross-link unreacted molecules of the at least one monomer to form a matrix material in which the nanoparticle-core polymer-shell nanocomposite particles are cross-linked to the matrix material.

28. A method, comprising:
preparing a mixture comprising metal, metal oxide, and/or semi-metallic nanoparticles and molecules of at least one monomer dispersed in a solvent, each nanoparticle having a surface and being insoluble in the solvent, the nanoparticles having a valence to conduction energy band gap of a similar magnitude as a highest occupied molecular orbital (HOMO) to lowest unoccupied molecular orbital (LUMO) energy band gap of the at least one monomer, the valence band of the nanoparticles being aligned with or above at least one HOMO or LUMO energy level of the at least one monomer;
allowing molecules of the at least one monomer to associate with the surfaces of the nanoparticles;
exposing the mixture to ultraviolet and/or visible light having at least one wavelength selected to photoactivate the surfaces of the nanoparticles and the molecules of the at least one monomer, the at least one wavelength being selected to excite generation of bound electron-hole pairs when the light is absorbed on the exposed surfaces of the nanoparticles and on the associated monomer molecules, thereby to preferentially induce covalent bonding of molecules of the at least one monomer to the surfaces of the nanoparticles and to each other on the surfaces, thereby forming polymer shells on the surfaces of the nanoparticles to form a suspension of nanoparticle-core polymer-shell nanocomposite particles; and
cross-linking the nanoparticle-core polymer-shell nanocomposite particles to a bulk polymer, to form a cross-linked polymer nanocomposite matrix comprising the nanocomposite particles, the cross-linked nanocomposite matrix being formed, after substantially completing formation of the polymer shells, by exposing the suspension to a reaction-inducing condition that comprises exposing the suspension to electromagnetic radiation to cross-link unreacted molecules of the at least one monomer to form a matrix material in which the nanoparticle-core polymer-shell nanocomposite particles are cross-linked to the matrix material.

29. A method, comprising:
preparing a mixture comprising metal, metal oxide, and/or semi-metallic nanoparticles and molecules of at least one monomer dispersed in a solvent, each nanoparticle having a surface and being insoluble in the solvent, the nanoparticles having a valence to conduction energy band gap of a similar magnitude as a highest occupied molecular orbital (HOMO) to lowest unoccupied molecular orbital (LUMO) energy band gap of the at least one monomer, the valence band of the nanoparticles being aligned with or above at least one HOMO or LUMO energy level of the at least one monomer;
allowing molecules of the at least one monomer to associate with the surfaces of the nanoparticles;
exposing the mixture to ultraviolet and/or visible light having at least one wavelength selected to photoactivate the surfaces of the nanoparticles and the molecules of the at least one monomer, the at least one wavelength being selected to excite generation of bound electron-hole pairs when the light is absorbed on the exposed surfaces of the nanoparticles and on the associated monomer molecules, thereby to preferentially induce covalent bonding of molecules of the at least one monomer to the surfaces of the nanoparticles and to each other on the surfaces, thereby forming polymer shells on the surfaces of the nanoparticles to form a suspension of nanoparticle-core polymer-shell nanocomposite particles;
cross-linking the nanoparticle-core polymer-shell nanocomposite particles to a bulk polymer, to form a cross-linked polymer nanocomposite matrix comprising the nanocomposite particles;
adding molecules of a second monomer to the suspension of nanoparticle-core polymer-shell nancomposite particles; and
exposing the suspension to a reaction-favoring condition that comprises a predetermined thermal condition favoring cross-linking of the molecules of the second monomer to each other and to the nanocomposite particles.

30. The method of claim 29, further comprising:
during exposing the mixture, monitoring a characteristic of unreacted molecules of the at least one monomer to determine an extent of bonding of the molecules to the surfaces of the nanoparticles; and
when the bonding reaches a desired extent, stopping the exposing.

31. The method of claim 29, wherein:
preparing the mixture further comprises adding molecules of at least one tethering agent to the mixture, along with the molecules of the at least one monomer; and
the light includes at least one wavelength selected also to photoactivate the molecules of the tethering agent, to induce also covalent bonding of molecules of the tethering agent to the surfaces of the nanoparticles, to the molecules of the at least one monomer, and to each other on the surfaces.

32. The method of claim 25, further comprising:

during exposing the mixture, monitoring a characteristic of unreacted molecules of the at least one monomer to determine an extent of bonding of the molecules to the surfaces of the nanoparticles; and when the bonding reaches a desired extent, stopping the exposing.

33. The method of claim 25, wherein:

preparing the mixture further comprises adding molecules of at least one tethering agent to the mixture, along with the molecules of the at least one monomer; and the electromagnetic radiation includes at least one wavelength selected also to photoactivate the molecules of the tethering agent, to induce also covalent bonding of molecules of the tethering agent to the surfaces of the nanoparticles, to the molecules of the at least one monomer, and to each other on the surfaces.

34. A nanocomposite material manufactured by the method of claim 25.

35. A magneto-optical device, comprising the nanocomposite material recited in claim 34.

36. A magneto-optical device, comprising a nanocomposite matrix comprising polymer-shelled nanoparticles recited in claim 25.

* * * * *